US012775828B2

(12) United States Patent
Kao et al.

(10) Patent No.: US 12,775,828 B2
(45) Date of Patent: Oct. 27, 2026

(54) BACK END FLOATING GATE STRUCTURE IN A SEMICONDUCTOR DEVICE

(71) Applicant: Taiwan Semiconductor Manufacturing Company, Ltd., Hsinchu (TW)

(72) Inventors: Yun-Feng Kao, New Taipei City (TW); Katherine H. Chiang, New Taipei City (TW); Chia Yu Ling, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 966 days.

(21) Appl. No.: 18/150,410

(22) Filed: Jan. 5, 2023

(65) Prior Publication Data

US 2024/0086692 A1 Mar. 14, 2024

Related U.S. Application Data

(60) Provisional application No. 63/375,320, filed on Sep. 12, 2022.

(51) Int. Cl.

*G06N 3/063* (2023.01)
*H10B 41/30* (2023.01)

(52) U.S. Cl.

CPC ............. *G06N 3/063* (2013.01); *H10B 41/30* (2023.02)

(58) Field of Classification Search

CPC ........ G06N 3/063; H10B 41/30; H10B 80/00; H10B 12/315; H10D 64/035

See application file for complete search history.

(56) References Cited

U.S. PATENT DOCUMENTS

| | | | | |
|---|---|---|---|---|
| 7,795,667 B2 * | 9/2010 | Iguchi | H10B 41/35 438/257 |
| 12,137,573 B2 * | 11/2024 | Wu | H10B 53/30 |
| 2008/0089127 A1 * | 4/2008 | Mokhlesi | G11C 16/0483 257/E21.205 |
| 2013/0267046 A1 * | 10/2013 | Or-Bach | H10W 20/021 257/E21.214 |
| 2020/0411078 A1 * | 12/2020 | Sharma | H10B 12/315 |
| 2022/0254897 A1 * | 8/2022 | Tsai | H10D 30/6739 |

(Continued)

FOREIGN PATENT DOCUMENTS

TW I238520 B 8/2005

*Primary Examiner* — Bitew A Dinke

(74) *Attorney, Agent, or Firm* — Harrity & Harrity, LLP

(57) ABSTRACT

A semiconductor device may include a non-volatile memory cell structure that may be formed in a back end region of a semiconductor device. The non-volatile memory cell structure may include a floating gate structure in which a portion of a dielectric layer is included between a gate structure and a word line conductive structure. The separation of the gate structure and the word line conductive structure by the dielectric layer results in the gate structure being a floating gate structure. This enables a charge to be selectively stored on the gate structure, even when power is removed from the word line conductive structure. The non-volatile memory cell structure along with a volatile memory cell structure are provided in the back end region of the semiconductor device, such that caching and long-term storage may be performed in the back end region of the semiconductor device.

20 Claims, 26 Drawing Sheets

(56) References Cited

U.S. PATENT DOCUMENTS

| | | | | |
|---|---|---|---|---|
| 2022/0271166 | A1* | 8/2022 | Tsai | H10D 30/6755 |
| 2022/0310610 | A1* | 9/2022 | Sharma | H10D 1/716 |
| 2023/0197135 | A1* | 6/2023 | Gomes | G11C 11/2297<br>365/145 |
| 2023/0197654 | A1* | 6/2023 | Gomes | H10B 53/20<br>257/296 |
| 2023/0200082 | A1* | 6/2023 | Gomes | H10B 53/30<br>257/295 |
| 2023/0369503 | A1* | 11/2023 | Tan | H10D 30/6713 |
| 2024/0421036 | A1* | 12/2024 | Kao | H10B 80/00 |

* cited by examiner

BACK END FLOATING GATE STRUCTURE IN A SEMICONDUCTOR DEVICE

CROSS-REFERENCE TO RELATED APPLICATION

This patent application claims priority to U.S. Provisional Patent Application No. 63/375,320, filed on Sep. 12, 2022, and entitled "BACK END FLOATING GATE STRUCTURE IN A SEMICONDUCTOR DEVICE." The disclosure of the prior application is considered part of and is incorporated by reference into this patent application.

BACKGROUND

Memory devices are used in a wide variety of applications. Memory devices are made up of a plurality of memory cells that are typically arranged in an array of a plurality of rows and a plurality of columns. One type of memory cell includes a dynamic random access memory (DRAM) cell. In some applications, a DRAM cell-based memory device may be selected as opposed to other types of memory cell-based memory devices due to DRAM cell's lower cost, smaller area, and ability to hold a greater amount of data relative to, for example, a static random access memory (SRAM) cell or another type of memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
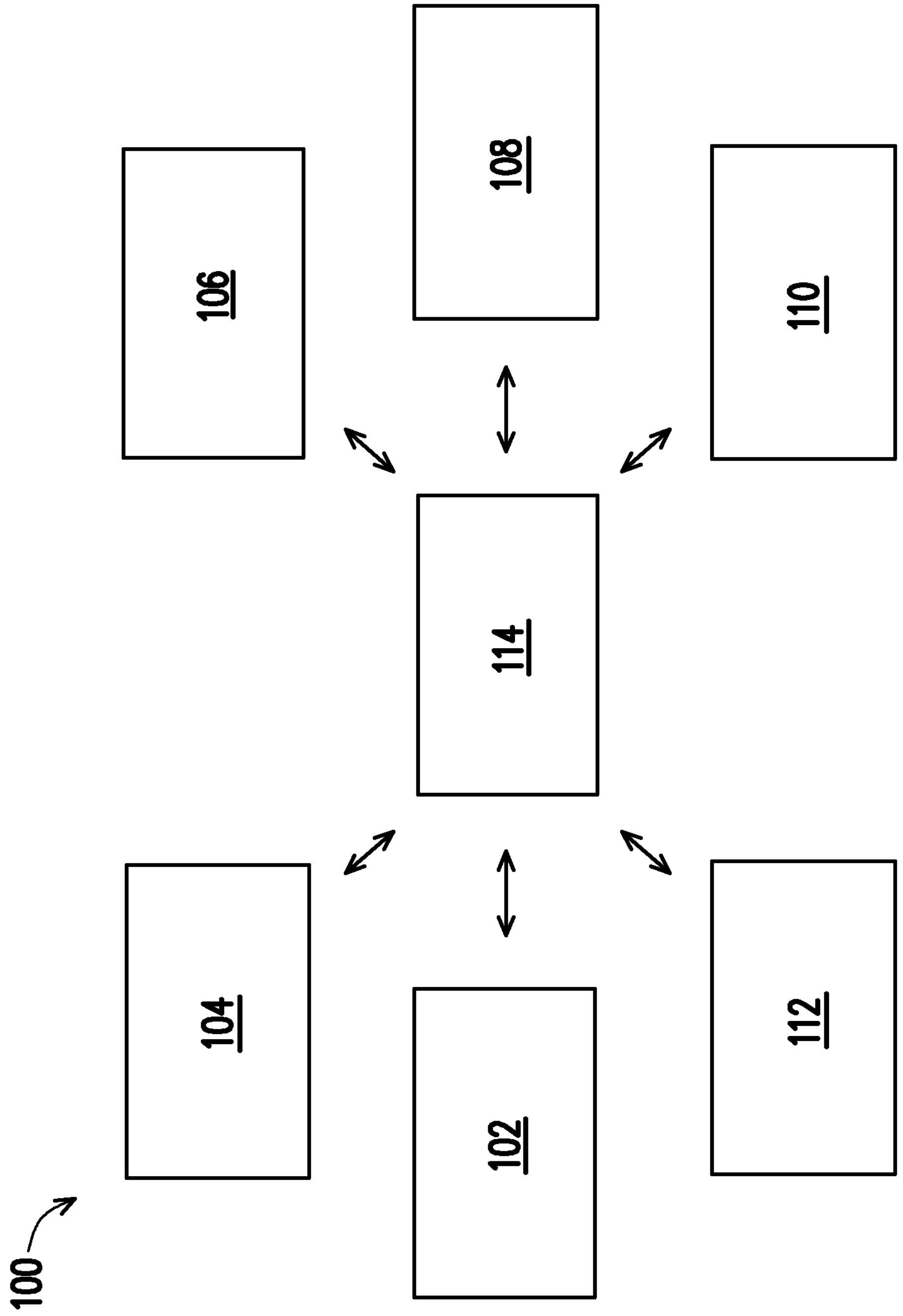
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A dynamic random access memory (DRAM) memory cell is a type of volatile memory cell that typically includes a transistor connected in series with a capacitor. This may be referred to as a one transistor-one capacitor (1T-1C) DRAM cell. The capacitor in a 1T-1C DRAM cell functions as a storage device by selectively storing electric charge. The capacitor may be charged through the transistor, and the amount of charge that is stored in the capacitor may be sensed by discharging the charge that is stored by the capacitor. The logical value (e.g., a 1-value or a 0-value) stored by the 1T-1C DRAM cell may correspond to the amount of charge that is stored by the capacitor.

A DRAM memory cell array may be implemented in a back end region (sometimes referred to as a back end of line (BEOL) region) of a semiconductor device. Peripheral circuitry may be included under the DRAM memory cell array, and may include circuits such as sense amplifier circuits, row decoder circuits, column decoder circuits, and/or address decoder circuits, among other examples. Including the peripheral circuitry under the DRAM memory cell array (a configuration that may be referred to as a circuit under array (CuA)) may enable the horizontal size of the semiconductor device to be reduced relative to if the peripheral circuitry were included adjacent to and/or around the DRAM memory cell array.

While a DRAM memory cell array may provide volatile memory for caching and other functions in a back end region of a semiconductor device, the data stored in the DRAM memory cell array is lost when power is removed from the semiconductor device due to the volatile nature of DRAM.

In some implementations described herein, a semiconductor device may include a non-volatile memory cell structure that may be formed in a back end region of a semiconductor device. The non-volatile memory cell structure may include a floating gate structure in which a portion of a dielectric layer is included between a gate structure and a word line conductive structure. The separation of the gate structure and the word line conductive structure by the dielectric layer results in the gate structure being a floating gate structure. This enables a charge to be selectively stored on the gate structure, even when power is removed from the word line conductive structure. The non-volatile memory cell structure along with a volatile memory cell structure (e.g., a DRAM memory cell structure) are provided in the back end region of the semiconductor device, such that caching and long-term storage may be performed in the back end region of the semiconductor device. Moreover, the non-volatile memory cell structure and the volatile memory cell structure may be formed by similar processing techniques and in the same operations without additional masking steps, which may reduce the complexity of forming the non-volatile memory cell structure and may result in minimal impact to back end processing cost and time for the semiconductor device. In addition, the floating gate structures described herein may be arranged in a series configuration to implement a neural network in which analog states may be obtained based on series resistances of the floating gate structures.

FIG. 1 is a diagram of an example environment 100 in which systems and/or methods described herein may be implemented. As shown in FIG. 1, the example environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the example environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

In some implementations, one or more of the semiconductor processing tools 102-112 and/or the wafer/die transport tool 114 may perform one or more semiconductor processing operations described herein. For example, one or more of the semiconductor processing tools 102-112 and/or the wafer/die transport tool 114 may form a plurality of back end dielectric layers; may form a conductive structure in a first back end dielectric layer of the plurality of back end dielectric layers; and/or may form a gate structure, of a non-volatile memory cell structure, in a second back end dielectric layer and a third back end dielectric layer of the plurality of back end dielectric layers, where the gate structure is over the conductive structure, and where a portion of the second back end dielectric layer is included between the conductive structure and the gate structure.

As another example, one or more of the semiconductor processing tools 102-112 and/or the wafer/die transport tool 114 may form a word line conductive structure in a semiconductor device; may form a first dielectric layer over the word line conductive structure; may form a second dielectric layer over the first dielectric layer; may form, over the word line conductive structure, a recess through the second dielectric layer and into the first dielectric layer such that a portion of the first dielectric layer remains over the word line conductive structure; may form a gate structure, of a non-volatile memory cell structure of the semiconductor device, in the recess such that the portion of the first dielectric layer is included between the gate structure and the word line conductive structure; may form a gate dielectric layer of the non-volatile memory cell structure over the gate structure; may form a channel layer of the non-volatile memory cell structure over the gate dielectric layer; and/or may form a plurality of source/drain regions of the non-volatile memory cell structure over the channel layer.

As another example, one or more of the semiconductor processing tools 102-112 and/or the wafer/die transport tool 114 may form a plurality of floating gate structures connected in series, the plurality of floating gate structure including respective gate structures included in each of the plurality of floating gate structures, and a gate dielectric layer that extends continuously over the respective gate structures; may form a channel layer that extends continuously over the gate dielectric layer; may form a plurality of word line conductive structures, where each of the plurality of word line conductive structures is electrically coupled with one of the respective gate structures; and/or may form a dielectric layer between the respective gate structures and the plurality of word line conductive structures.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
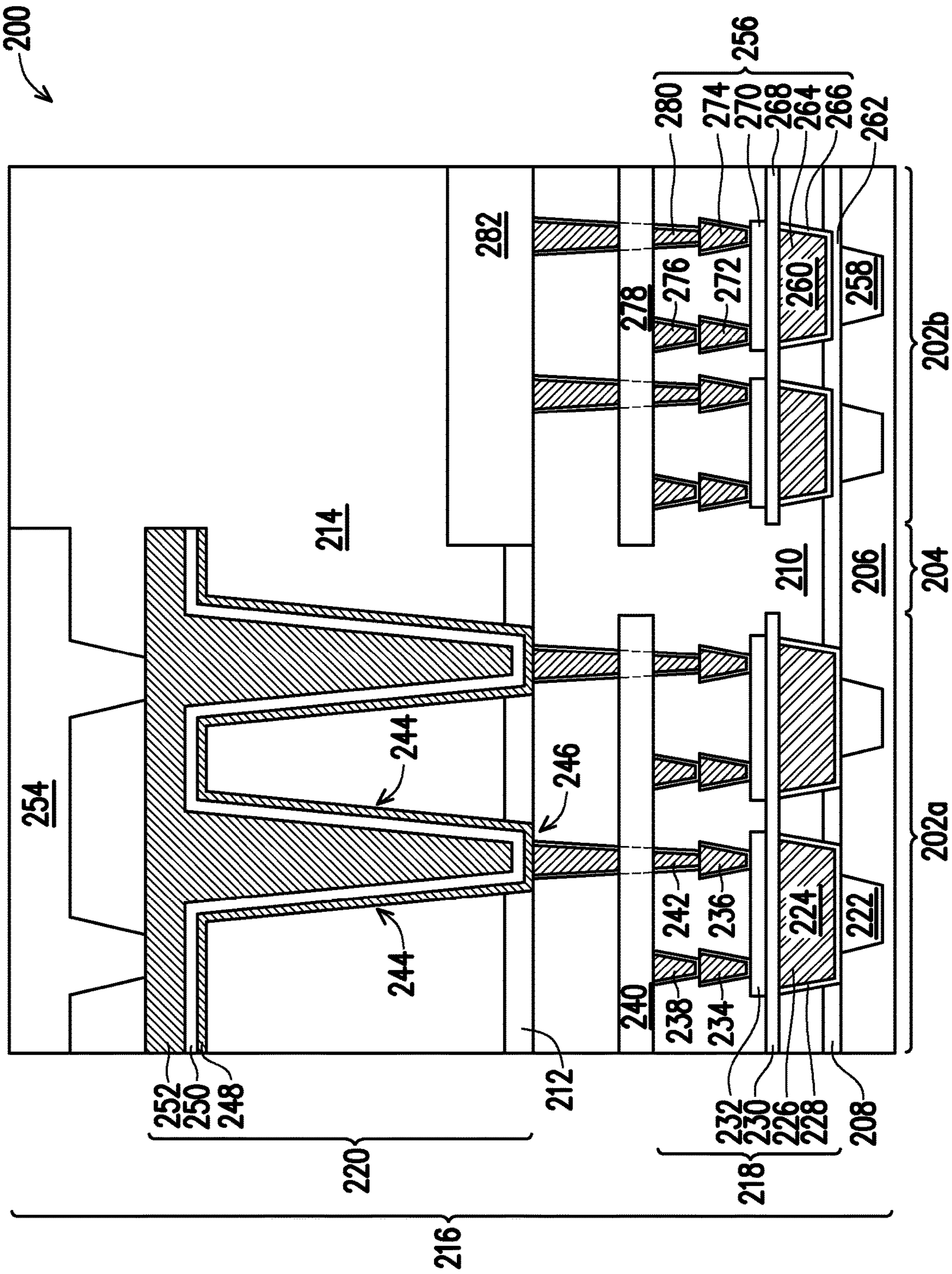
FIG. 2 is a diagram of an example semiconductor device described herein.

FIG. 2 is a diagram of an example semiconductor device 200 described herein. In particular, FIG. 2 illustrates a back end region or BEOL region of the semiconductor device 200.

As shown in FIG. 2, a volatile memory array 202*a* and a non-volatile memory array 202*b* may be included in the back end region of the semiconductor device 200. The volatile memory array 202*a* and the non-volatile memory array 202*b* may be physically and/or electrically isolated by a non-array region 204 between the volatile memory array 202*a* and the non-volatile memory array 202*b*.

As shown in FIG. 2, the volatile memory array 202*a* and the non-volatile memory array 202*b* may be included in one or more back end layers of the semiconductor device 200. The back end dielectric layer(s) may include a dielectric layer 206 (e.g., an interlayer dielectric (ILD) layer), a dielectric layer 208 (e.g., an etch stop layer (ESL)) over and/or on the dielectric layer 206, a dielectric layer 210 (e.g., another ILD layer) over and/or on the dielectric layer 208, a dielectric layer 212 (e.g., another ESL) over and/or on the dielectric layer 210, and a dielectric layer 214 (e.g., another ILD layer) over and/or on the dielectric layer 212, among other examples. In some implementations, one or more of the dielectric layers 206-214 may include a plurality of layers. For example, the dielectric layer 210 may include a plurality of ILD layers.

The dielectric layers 206, 210, and 214 may each include one or more low dielectric constant (low-k) dielectric materials such as a silicon oxide ($SiO_x$), fluoride-doped silicate glass (FSG), and/or another low-k dielectric material. The dielectric layers 208 and 212 may each include one or more high dielectric constant (high-k) dielectric materials to provide etch selectivity relative to the dielectric layers 206, 210, and 214. Examples of high-k dielectric materials include dielectric materials having a dielectric constant greater than the dielectric constant of silicon oxide (approximately 3.6), such as aluminum oxide ($AlO_x$), silicon carbon nitride (SiCN), and/or silicon nitride ($Si_xN_y$), among other examples.

The volatile memory array 202*a* may include a plurality of volatile memory cell structures 216 in the back end dielectric layer(s) of the semiconductor device 200. The volatile memory cell structures 216 may include DRAM memory cell structures and/or another type of volatile memory cell structures. In implementations where a volatile memory cell structure 216 includes a DRAM memory cell structure, the volatile memory cell structure 216 may include a transistor structure 218 and a capacitor structure 220. The capacitor structure 220 may be configured to selectively store an electrical charge corresponding to a logical value (e.g., a 1-value or a 0-value) stored by the volatile memory cell structure 216. The transistor structure 218 may be configured to selectively control access to the capacitor structure 220. For example, the transistor structure 218 may be activated to enable a charge to be provided to the capacitor structure 220 through the transistor structure 218. As another example, the transistor structure 218 may be deactivated to enable a charge to be stored in (e.g., to remain in) the capacitor structure 220. As another example, the transistor structure 218 may be activated to perform a "read" operation in which a charge stored in the capacitor structure 220 is discharged through the transistor structure 218 and measured.

As shown in FIG. 2, a volatile memory cell structure 216 may include a word line conductive structure 222 in the dielectric layer 206 below and/or under the transistor structure 218. The word line conductive structure 222 may also be referred to as an access line conductive structure, a select line conductive structure, an address line conductive structure, and/or a row line conductive structure, among other examples. The word line conductive structure 222 may be configured to selectively provide a voltage or current to a gate structure 224 of the transistor structure 218 for performing access operations associated with the volatile memory cell structure 216. The word line conductive structure 222 may include a trench, a via, metal line, a metallization layer, and/or another type of conductive structure. The word line conductive structure 222 may include one or more conductive materials, such as one or more metals, one or more metal alloys, and/or one or more other types of conductive materials. Examples include copper (Cu), cobalt (Co), ruthenium (Ru), titanium (Ti), tungsten (W), gold (Au), and/or silver (Ag), among other examples.

The gate structure 224 of the transistor structure 218 may be located over and/or on the word line conductive structure 222. In particular, the gate structure 224 and the word line conductive structure 222 may be in direct physical contact such that a current or a voltage may be directly applied to the gate structure 224 from the word line conductive structure 222. The gate structure 224 may be included in the dielectric layers 208 and 210. The gate structure 224 may include a gate electrode 226 surrounded by one or more liner layers 228 between the gate electrode 226 and the word line conductive structure 222. The gate electrode 226 may include polysilicon (e.g., polycrystalline silicon), one or more conductive materials, one or more high-k materials, and/or a combination thereof. The liner layer(s) 228 may include adhesion liners (e.g., liners that are included to promote adhesion between the gate electrode 226 and the dielectric layers 208 and 210), barrier layers (e.g., layers that are included to reduce or minimize diffusion of the material of the gate electrode 226 into the dielectric layers 208 and 210 and/or into the word line conductive structure 222), and/or another type of liner layers.

A gate dielectric layer 230 may be included over and/or on the gate structure 224. The gate dielectric layer 230 may be included in the dielectric layer 210. In some implementations, each transistor structure 218 includes a separate gate dielectric layer 230. In some implementations, two or more transistor structures 218 in the volatile memory array 202*a* share the same gate dielectric layer 230. In other words, a gate dielectric layer 230 may extend and/or span across gate structures 224 of a plurality of transistor structures 218. The gate dielectric layer 230 may include one or more dielectric materials, including high dielectric constant (high-k) materials such as hafnium silicate ($HfO_xSi$), zirconium silicate ($ZrSiO_x$), hafnium oxide ($HfO_x$), and/or zirconium oxide ($ZrO_x$), among other examples.

Each transistor structure 218 may include a channel layer 232 over and/or on the gate dielectric layer 230. The channel layer 232 may include one or more semiconductor materials, such as silicon (Si), germanium (Ge), doped silicon, doped germanium, indium zinc oxide (InZnO), indium tin oxide (InSnO), indium oxide ($InxO_y$ such as $In_2O_3$), gallium oxide (GaxOy such as $Ga_2O_3$), indium gallium zinc oxide (InGaZnO), zinc oxide (ZnO), aluminum zinc oxide ($Al_xO_yZn_z$ such as $Al_2O_5Zn_2$), aluminum doped zinc oxide, titanium oxide ($TiO_x$), III-V semiconductor materials, and/or combinations (e.g., alloys or stacked layers) of semiconductor materials, among other examples. This enables a conductive channel to be selectively formed in the channel layer 232 based on current or a voltage being applied to the gate structure 224.

Source/drain regions 234 and 236 may be included over and/or on the channel layer 232. A source/drain region, as used herein, may refer to a source region, a drain region, or both a source region and a drain region, depending on the context. The source/drain regions 234 and 236 may be electrically coupled with channel layer 232 such that current is selectively permitted to flow between the source/drain regions 234 and 236 through the channel layer 232. The source/drain regions 234 and 236 may each include one or more semiconductor materials, such as silicon (Si), germanium (Ge), doped silicon, and/or doped germanium, among other examples.

The source/drain regions 234 and 236 may be respectively coupled with interconnect structures. For example, the source/drain region 234 may be coupled with an interconnect structure 238 that is located over and/or on the source/drain region 234. The interconnect structure 238 may electrically couple the source/drain region 234 with a bit line conductive structure 240. The bit line conductive structure 240 may also be referred to as a column line conductive structure. The bit line conductive structure 240 may be located over and/or on the interconnect structure 238, and may be configured to selectively receive a current from the capacitor structure 220 or to provide a current to the capacitor structure 220 through the transistor structure 218.

As another example, the source/drain region 236 may be coupled with an interconnect structure 242 that is located over and/or on the source/drain region 236. In the diagram in FIG. 2, the interconnect structure 242 is located behind the bit line conductive structure 240 and is not in physical contact with the bit line conductive structure 240. The interconnect structure 242 electrically couples the source/drain region 236 with the capacitor structure 220.

The interconnect structures 238 and 242, and the bit line conductive structure 240, may each include vias, plugs, trenches, dual damascene structures, and/or another type of conductive structures. The interconnect structures 238 and 242, and the bit line conductive structure 240, may each include one or more conductive materials, such as one or more metals, one or more metal alloys, and/or one or more other types of conductive materials. Examples include copper (Cu), cobalt (Co), ruthenium (Ru), titanium (Ti), tungsten (W), gold (Au), and/or silver (Ag), among other examples.

The capacitor structure 220 may include a deep trench capacitor (DTC) structure having a relatively high aspect ratio between the height of the capacitor structure 220 and a width or critical dimension (CD) of the capacitor structure 220. The capacitor structure 220 may include sidewalls 244 and a bottom surface 246 connecting the sidewalls 244. The capacitor structure 220 may be coupled with the interconnect structure 242 at the bottom surface 246 of the capacitor structure 220. The capacitor structure 220 may be located in the dielectric layers 212 and 214, with the bottom of the capacitor structure 220 extending through the dielectric layer 212 such that the bottom surface 246 is located in the dielectric layer 212.

As further shown in FIG. 2, the capacitor structure 220 may include a plurality of layers, such as a conductive layer 248 over and/or on the sidewalls 244 and bottom surface 246, a dielectric layer 250 over and/or on the conductive layer 248, and another conductive layer 252 over and/or on the dielectric layer 250. The conductive layers 248 and 252 may correspond to the electrical conductors of the capacitor structure 220, and the dielectric layer 250 may correspond to the dielectric medium between the electrical conductors, thereby enabling a charge to be stored in the capacitor structure 220 based on an electric field between the electrical conductors. The deep trench structure of the capacitor structure 220 enables the surface area of the conductive layers 248 and 252 to be increased with minimal increase to the horizontal footprint of the capacitor structure 220, which increases the capacitive storage capacity of the capacitor structure 220.

A ground conductive structure 254 may be included over and/or on the capacitor structure 220. The ground conductive structure 254 may include vias, plugs, trenches, dual damascene structures, and/or another type of conductive structures. The ground conductive structure 254 may be configured as an electrical ground for the volatile memory cell structure 216. The ground conductive structure 254 may include one or more conductive materials, such as one or more metals, one or more metal alloys, and/or one or more other types of conductive materials. Examples include copper (Cu), cobalt (Co), ruthenium (Ru), titanium (Ti), tungsten (W), gold (Au), and/or silver (Ag), among other examples.

As further shown in FIG. 2, the non-volatile memory array **202*b* may include a plurality of non-volatile memory cell structures 256. The non-volatile memory cell structures 256** may be configured to selectively store a charge (corresponding to a logical value such as a 1-value or a 0-value) in a floating gate structure.

As shown in FIG. 2, a non-volatile memory cell structure 256 may be electrically coupled with a word line conductive structure 258 included in the dielectric layer 206. The non-volatile memory cell structure 256 may include a gate structure 260 over the word line conductive structure 258. The gate structure 260 may be referred to as a floating gate structure in that the gate structure 260 is not directly (or physically) connected with the word line conductive structure 258. Instead, a portion 262 of the dielectric layer 208 (e.g., an ESL) is located between the gate structure 260 and the word line conductive structure 258. In this way, the gate structure 260 is spaced apart from the word line conductive structure 258. The gap between the gate structure 260 and the word line conductive structure 258 enables a charge to be retained or stored in a gate electrode 264 of the gate structure 260 when a voltage or current is removed from the word line conductive structure 258. The high-k dielectric material of the dielectric layer 208 may provide low current leakage between the gate structure 260 and the word line conductive structure 258 through the portion 262.

The gate electrode 264 is surrounded by one or more liner layers 266 between the gate electrode 264 and the dielectric layers 208 and 210. The gate electrode 264 may include polysilicon (e.g., polycrystalline silicon), one or more conductive materials, one or more high-k materials, and/or a combination thereof. The liner layer(s) 266 may include adhesion liners (e.g., liners that are included to promote adhesion between the gate electrode 264 and the dielectric layers 208 and 210), barrier layers (e.g., layers that are included to reduce or minimize diffusion of the material of the gate electrode 264 into the dielectric layers 208 and 210), and/or another type of liner layers.

A gate dielectric layer 268 may be included over and/or on the gate structure 260. The gate dielectric layer 268 may be included in the dielectric layer 210. In some implementations, each non-volatile memory cell structure 256 includes a separate gate dielectric layer 268. In some implementations, two or more non-volatile memory cell structures 256 in the non-volatile memory array **202*b* share the same gate dielectric layer 268. In other words, a gate dielectric layer 268 may extend and/or span across gate structures 260 of a plurality of non-volatile memory cell structures 256. The gate dielectric layer 268** may include one or more dielectric materials, including high-k materials such as hafnium silicate ($HfO_xSi$), zirconium silicate ($ZrSiO_x$), hafnium oxide ($HfO_x$), and/or zirconium oxide ($ZrO_x$), among other examples.

Each non-volatile memory cell structure 256 may include a channel layer 270 over and/or on the gate dielectric layer 268. A channel layer 270 may include one or more semiconductor materials, such as silicon (Si), germanium (Ge), doped silicon, and/or doped germanium, among other examples. This enables a conductive channel to be selectively formed in the channel layer 270 based on current or a voltage being applied to the gate structure 260.

Source/drain regions 272 and 274 may be included over and/or on the channel layer 270. The source/drain regions 272 and 274 may be electrically coupled with channel layer 270 such that current is selectively permitted to flow between the source/drain regions 272 and 274 through the channel layer 270. The source/drain regions 272 and 274 may each include one or more semiconductor materials, such as silicon (Si), germanium (Ge), doped silicon, and/or doped germanium, among other examples.

The source/drain regions 272 and 274 may be respectively coupled with interconnect structures. For example, the source/drain region 272 may be coupled with an interconnect structure 276 that is located over and/or on the source/drain region 272. The interconnect structure 276 may electrically couple the source/drain region 272 with a bit line conductive structure 278. The bit line conductive structure 278 may be located over and/or on the interconnect structure 276.

As another example, the source/drain region 274 may be coupled with an interconnect structure 280 that is located over and/or on the source/drain region 274. In the diagram in FIG. 2, the interconnect structure 280 is located behind the bit line conductive structure 278 and is not in physical contact with the bit line conductive structure 278. The interconnect structure 280 electrically couples the source/drain region 274 with a select line conductive structure 282. The bit line conductive structure 278 and the select line conductive structure 282 are configured to enable the non-volatile memory cell structure 256 to be selectively programmed or erased.

The interconnect structures 276 and 280, the bit line conductive structure 278, and the select line conductive structure 282 may each include vias, plugs, trenches, dual damascene structures, and/or another type of conductive structures. The interconnect structures 276 and 280, the bit line conductive structure 278, and the select line conductive structure 282 may each include one or more conductive materials, such as one or more metals, one or more metal alloys, and/or one or more other types of conductive materials. Examples include copper (Cu), cobalt (Co), ruthenium (Ru), titanium (Ti), tungsten (W), gold (Au), and/or silver (Ag), among other examples.

As indicated above, FIG. 2 is provided as an example. Other examples may differ from what is described with regard to FIG. 2.

Figure 3:
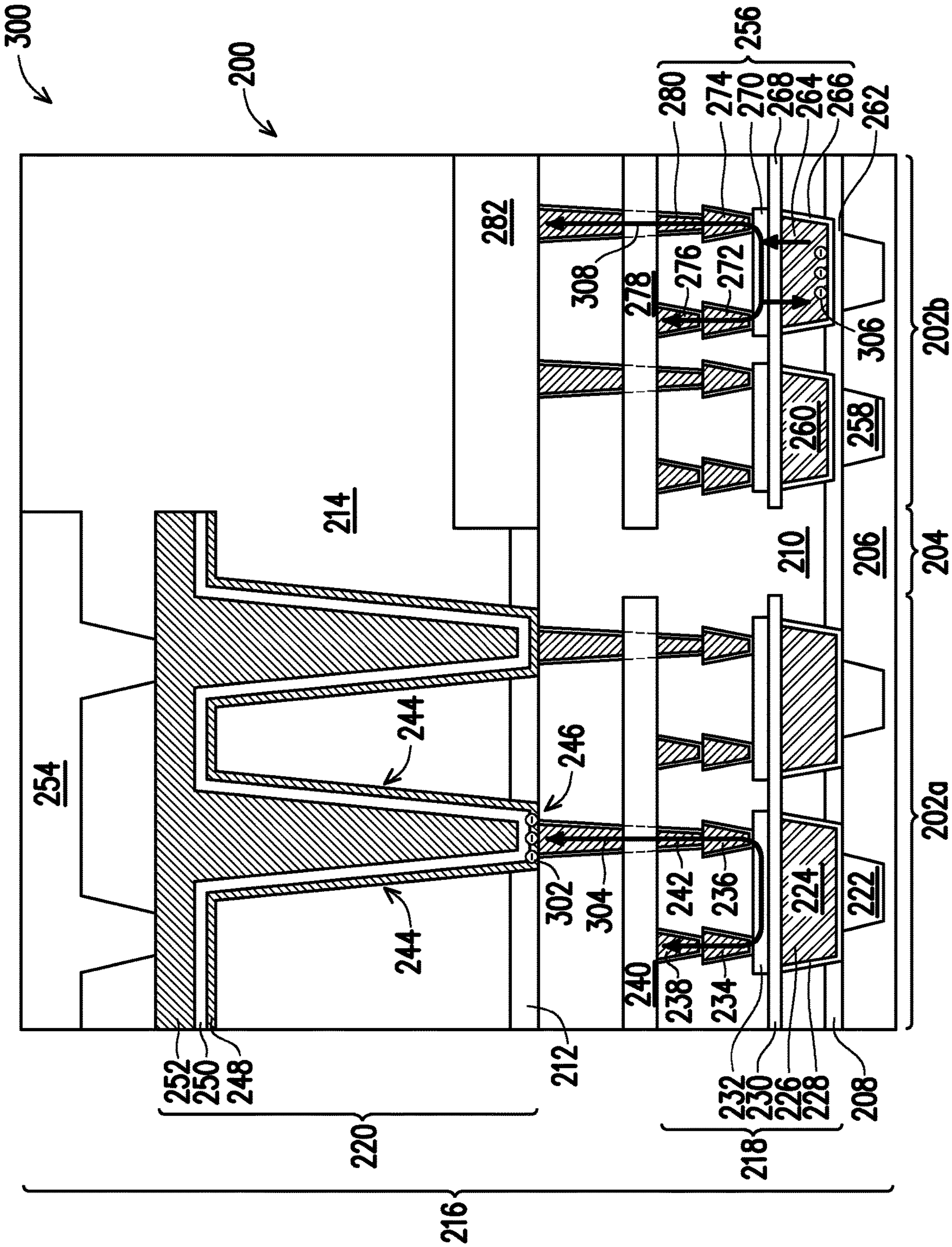
FIGS. 3, 4A, 4B, 5A, and 5B are diagrams of example implementations of a semiconductor device described herein.

FIG. 3 is a diagram of an example implementation 300 of the semiconductor device 200 described herein. In particular, the example implementation 300 includes an example implementation of the operation of a volatile memory cell structure 216 in the volatile memory array 202*a* of the semiconductor device 200, and an example implementation of the operation of a non-volatile memory cell structure 256 in the non-volatile memory array 202*b* of the semiconductor device 200.

As shown in FIG. 3, a capacitor structure 220 of the volatile memory cell structure 216 may selectively store a charge 302 corresponding to the logical value stored by the volatile memory cell structure 216. For example, a charge 302 at a first voltage may correspond to a 1-value, and the absence of the charge 302 in the capacitor structure 220 may correspond to a second voltage at a 0-value. A flow path 304 between the bit line conductive structure 240 and the capacitor structure 220 may enable the volatile memory cell structure 216 to be selectively programmed (e.g., written to), read from, or erased.

For example, the charge 302 may be provided to the capacitor structure 220 from the bit line conductive structure 240 to write a logical value to the volatile memory cell structure 216. Here, the charge 302 traverses along the flow path 304 from the bit line conductive structure 240, through the interconnect structure 238, through the source/drain region 234, through the channel layer 232 of a transistor structure 218, through the source/drain region 236, and through the interconnect structure 242 to the capacitor structure 220. A current or a voltage may be applied to the gate structure 224 from the word line conductive structure 222 to enable the charge 302 to flow through the channel layer 232. Moreover, a voltage may be applied to the bit line conductive structure 240 such that the electrical potential on the conductive layer 248 is greater relative to the electrical potential on the conductive layer 252 (which is grounded to 0 volts) to facilitate charging of the capacitor structure 220 through the transistor structure 218.

To read from or erase the logical value stored by the volatile memory cell structure 216, a current or a voltage may be applied to the gate structure 224 from the word line conductive structure 222 to enable the charge 302 to flow through the channel layer 232. The voltage may be removed from the bit line conductive structure 240 such that the charge 302 flows from the capacitor structure 220 to the bit line conductive structure 240 along the flow path 304 through the transistor structure 218.

For the non-volatile memory cell structure 256 in the non-volatile memory array 202*b*, a charge 306 may be selectively stored in the gate structure 260. To store the charge 306 in the gate structure 260, the bit line conductive structure 278 may be connected to an electrical ground such that the electrical potential on the bit line conductive structure 278 is approximately 0 volts. Voltages may be applied to the word line conductive structure 258 and the select line conductive structure 282. The electrical potential on the select line conductive structure 282 may be greater relative to the electrical potential on the bit line conductive structure 278 to facilitate the flow of electrons along the flow path 308. Moreover, the electrical potential on the word line conductive structure 258 may be greater relative to the electrical potential on the bit line conductive structure 278 and the select line conductive structure 282 to facilitate the tunneling of electrons through the gate dielectric layer 268 and into the gate structure 260.

To remove the charge 306 in the gate structure 260, the word line conductive structure 258 may be connected to an electrical ground such that the electrical potential on the word line conductive structure 258 is approximately 0 volts. Voltages may be applied to the bit line conductive structure 278 and the select line conductive structure 282 such that the electrical potential on the bit line conductive structure 278 and on the select line conductive structure 282 are greater relative to the electrical potential on the word line conductive structure 258 to facilitate the tunneling of electrons through the gate dielectric layer 268 and out of the gate structure 260.

The charge 306 selectively stored in the gate structure 260 directly affects the threshold voltage ($V_t$) of the non-volatile memory cell structure 256. With no charge 306 stored in the gate structure 260, the threshold voltage is low, meaning that a relatively low threshold voltage is needed to form a conductive channel in the channel layer 270 through which electrons may propagate between the source/drain regions 272 and 274. This results in a relatively low voltage needed to achieve a threshold source to drain current ($I_{DS}$) magnitude that may be read from the non-volatile memory cell structure 256. Conversely, if a charge 306 is stored in the gate structure 260, a relatively higher threshold voltage (e.g., relative to the threshold voltage when no charge 306 is stored in the gate structure 260) is needed in order to form a conductive channel in the channel layer 270 through which electrons may propagate between the source/drain regions 272 and 274. This results in a relatively high voltage that is needed to achieve a threshold source to drain current ($I_{DS}$) magnitude that may be read from the non-volatile memory cell structure 256. The difference in threshold voltages based on whether a charge 306 is stored in the gate structure 260 may enable different logical values to be selectively stored in the non-volatile memory cell structure 256. For example, a low threshold voltage may correspond to a 0-value, and a high threshold voltage may correspond to a 1-value.

As indicated above, FIG. 3 is provided as an example. Other examples may differ from what is described with regard to FIG. 3.

Figure 4A:
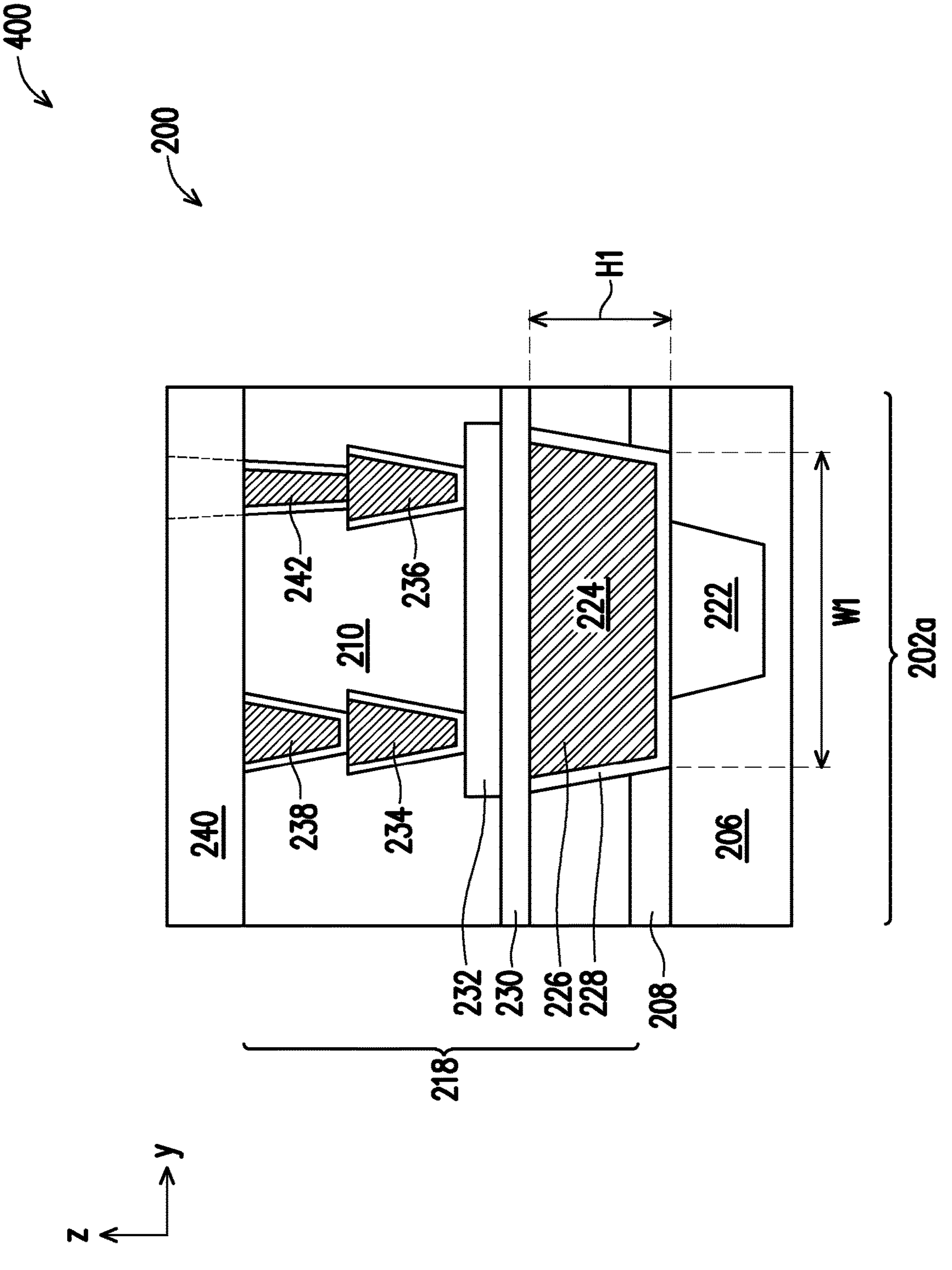
Figure 4B:
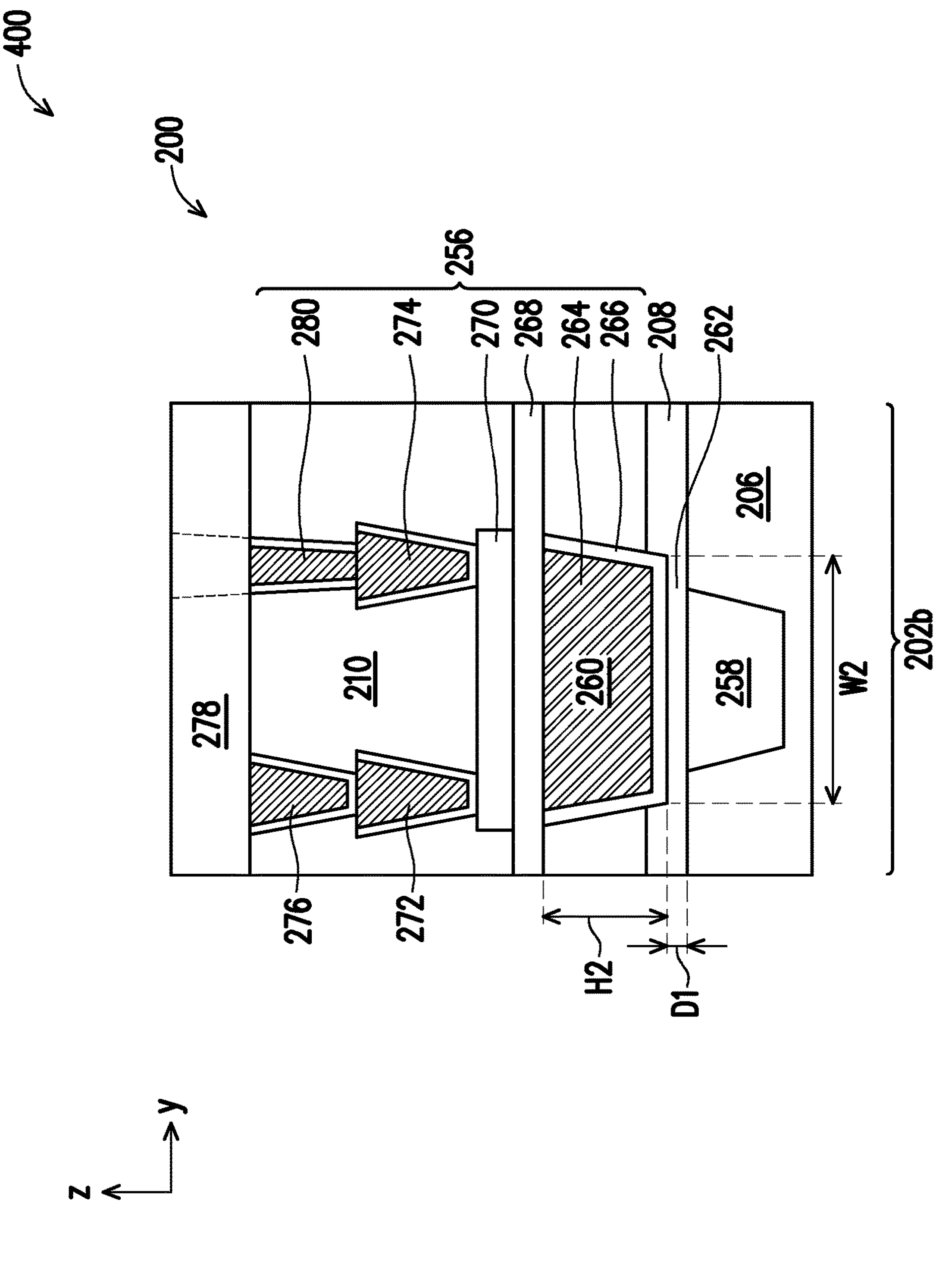

FIGS. 4A and 4B are diagrams of example implementations 400 of the semiconductor device 200 described herein. FIGS. 4A and 4B include cross-section views of the semiconductor device 200. FIG. 4A illustrates example dimensions of a transistor structure 218 of a volatile memory cell structure 216 in the volatile memory array 202*a* of the semiconductor device 200. FIG. 4B illustrates example dimensions of a non-volatile memory cell structure 256 in the non-volatile memory array 202*b* of the semiconductor device 200.

As shown in FIG. 4A, an example dimension of the transistor structure 218 may include a width W1 of a gate structure 224 of the transistor structure 218. The width W1 may be referred to as a bottom critical dimension of the gate structure 224. The width W1 may be in a y-direction in the semiconductor device 200, which may correspond to a horizontal direction in the semiconductor device 200 across the source/drain regions 234 and 236. In some implementations, the width W1 is included in a range of approximately 30 nanometers to approximately 200 nanometers. However, other values for the range are within the scope of the present disclosure.

As further shown in FIG. 4A, another example dimension of the transistor structure 218 may include a height H1 of a gate structure 224 of the transistor structure 218. The height H1 may be in a z-direction in the semiconductor device 200, which may correspond to a vertical direction in the semiconductor device 200. In some implementations, the height H1 is included in a range of approximately 200 angstroms to approximately 1000 angstroms. However, other values for the range are within the scope of the present disclosure.

As shown in FIG. 4B, an example dimension of the non-volatile memory cell structure 256 may include a width W2 of a gate structure 260 of the non-volatile memory cell structure 256. The width W2 may be referred to as a bottom critical dimension of the gate structure 260. The width W2 may be in a y-direction in the semiconductor device 200, which may correspond to a horizontal direction in the semiconductor device 200 across the source/drain regions 272 and 274. In some implementations, the width W2 is included in a range of approximately 20 nanometers to approximately 190 nanometers to facilitate under etching of the dielectric layer 208 for forming gate structure 260 as a floating gate structure. However, other values for the range are within the scope of the present disclosure.

As further shown in FIG. 4B, another example dimension of the non-volatile memory cell structure 256 may include a height H2 of a gate structure 260 of the non-volatile memory cell structure 256. The height H2 may be in a z-direction in the semiconductor device 200, which may correspond to a vertical direction in the semiconductor device 200. In some implementations, the height H2 is included in a range of approximately 200 angstroms to approximately 1000 angstroms. However, other values for the range are within the scope of the present disclosure.

The width W1 of the gate structure 224 of the transistor structure 218 may be greater relative to the width W2 of the gate structure 260 of the non-volatile memory cell structure 256. The width W2 of the gate structure 260 may be lesser relative to the width W1 of the gate structure 224 to enable the gate structure 260 to be formed such that the portion 262 of the dielectric layer 208 remains between the gate structure 260 and the word line conductive structure 258. As described herein the lesser width of the width W2 of the gate structure 260 results in under etching of a recess in which the gate structure 260 is to be formed, thereby leaving behind the portion 262 of the dielectric layer 208 above and/or over the word line conductive structure 258.

As further shown in FIG. 4B, another example dimension of the non-volatile memory cell structure 256 may include a distance D1 between the word line conductive structure 258 and the gate structure 260 of the non-volatile memory cell structure 256. The distance D1 may correspond to the remaining thickness of the portion 262 of the dielectric layer 208 between the word line conductive structure 258 and the gate structure 260. The distance D1 may be in a z-direction in the semiconductor device 200, which may correspond to a vertical direction in the semiconductor device 200. In some implementations, the distance D1 is included in a range of approximately 30 angstroms to approximately 100 angstroms to achieve a sufficiently low current leakage for the gate structure 260 while achieving a sufficiently high write speed for the non-volatile memory cell structure 256. However, other values for the ranges are within the scope of the present disclosure.

As indicated above, FIGS. 4A and 4B are provided as examples. Other examples may differ from what is described with regard to FIGS. 4A and 4B.

Figure 5A:
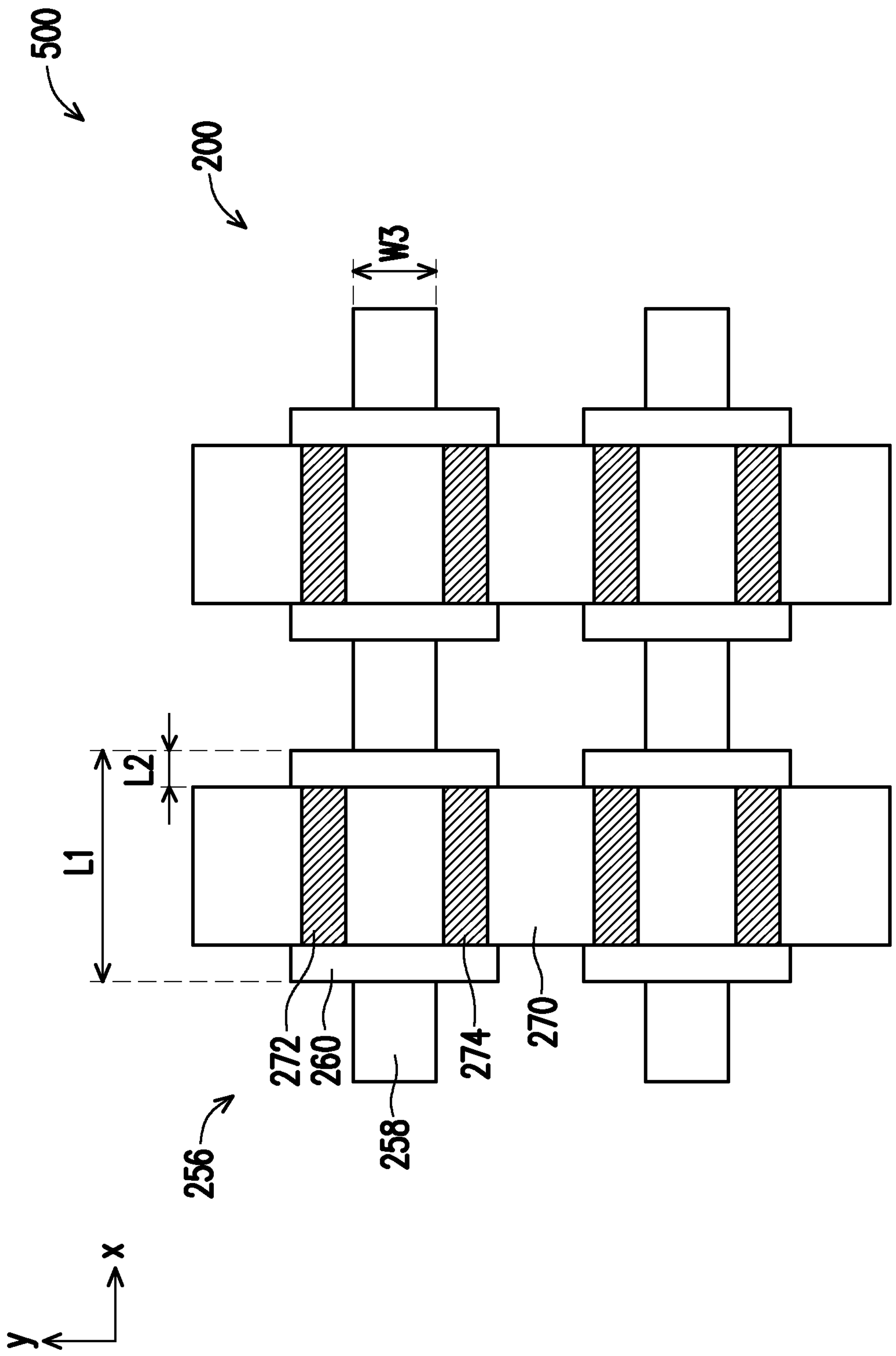
Figure 5B:
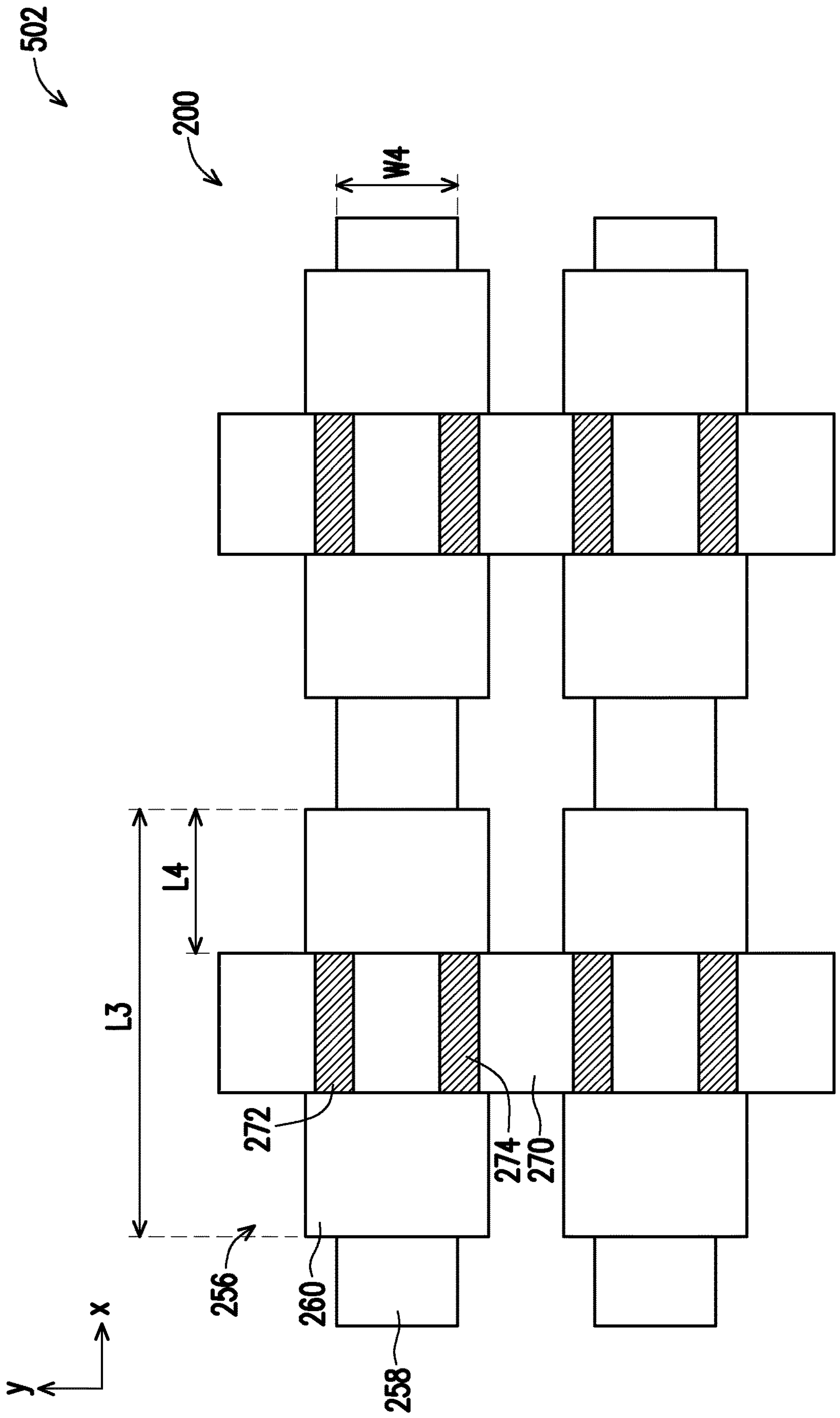

FIGS. 5A and 5B are diagrams of example implementations of the semiconductor device 200 described herein. FIGS. 5A and 5B include top-down views of the semiconductor device 200. FIG. 5A illustrates example dimensions of an example implementation 500 in which non-volatile memory cell structures 256 are configured to enable a high density of non-volatile memory cell structures 256 to be included in the volatile memory array 202*a* of the semiconductor device 200. FIG. 5B illustrates example dimensions of an example implementation 502 in which non-volatile memory cell structures 256 are configured to enable a low programming voltage to be used for the non-volatile memory cell structures 256 in the volatile memory array 202*a* of the semiconductor device 200.

In general, the word line conductive structures 258 and the gate structures 260 of the non-volatile memory cell structures 256 in the example implementation 500 in FIG. 5A are lesser in size relative to the word line conductive structures 258 and the gate structures 260 of the non-volatile memory cell structures 256 in the example implementation 502 in FIG. 5B. The smaller size of the word line conductive structures 258 and the gate structures 260 of the non-volatile memory cell structures 256 in the example implementation 500 in FIG. 5A enables a greater density of non-volatile memory cell structures 256 to be included in a non-volatile memory array 202*b* relative to the example implementation 502 in FIG. 5B. The word line conductive structures 258 and the gate structures 260 of the non-volatile memory cell structures 256 in the example implementation 502 in FIG. 5B are greater in size relative to the word line conductive structures 258 and the gate structures 260 of the non-volatile memory cell structures 256 in the example implementation 500 in FIG. 5A. The larger size of the word line conductive structures 258 and the gate structures 260 of the non-volatile memory cell structures 256 in the example implementation 502 in FIG. 5B provides a greater surface area for electron tunneling between the word line conductive structures 258 and the gate structures 260, which enables a lesser programing voltage to be used relative to the example implementation 500 in FIG. 5A.

As shown in FIG. 5A, an example dimension of a non-volatile memory cell structure 256 may include a width W3 of a word line conductive structure 259 of the non-volatile memory cell structure 256. The width W3 may be in they-direction in the semiconductor device 200, which may correspond to a horizontal direction in the semiconductor device 200 across the source/drain regions 272 and 274. In some implementations, the width W3 is included in a range of approximately 20 nanometers to approximately 100 nanometers. However, other values for the range are within the scope of the present disclosure.

As further shown in FIG. 5A, an example dimension of a non-volatile memory cell structure 256 may include a length L1 of a gate structure 260 of the non-volatile memory cell structure 256. The length L1 may be in the x-direction in the semiconductor device 200, which may correspond to a horizontal direction in the semiconductor device 200 along the word line conductive structures 258. In some implementations, the length L1 is included in a range of approximately 50 nanometers to approximately 200 nanometers. However, other values for the range are within the scope of the present disclosure.

As further shown in FIG. 5A, an example dimension of a non-volatile memory cell structure 256 may include a length L2 of an extension of a gate structure 260 outward from underneath a corresponding channel layer 270. The length L2 may be in the x-direction in the semiconductor device 200, which may correspond to a horizontal direction in the semiconductor device 200 along the word line conductive structures 258. In some implementations, the length L2 is included in a range of approximately 5 nanometers to approximately 50 nanometers. However, other values for the range are within the scope of the present disclosure.

As shown in FIG. 5B, an example dimension of a non-volatile memory cell structure 256 may include a width W4 of a word line conductive structure 258 of the non-volatile memory cell structure 256. The width W4 may be in they-direction in the semiconductor device 200, which may correspond to a horizontal direction in the semiconductor device 200 across the source/drain regions 272 and 274. In some implementations, the width W4 is included in a range of approximately 30 nanometers to approximately 110 nanometers. However, other values for the range are within the scope of the present disclosure. The width W4 may be greater relative to the width W3.

As further shown in FIG. 5B, an example dimension of a non-volatile memory cell structure 256 may include a length L3 of a gate structure 260 of the non-volatile memory cell structure 256. The length L3 may be in the x-direction in the semiconductor device 200, which may correspond to a horizontal direction in the semiconductor device 200 along the word line conductive structures 258. In some implementations, the length L3 is included in a range of approximately 80 nanometers to approximately 230 nanometers. However, other values for the range are within the scope of the present disclosure. The length L3 may be greater relative to the length L1.

As further shown in FIG. 5B, an example dimension of a non-volatile memory cell structure 256 may include a length L4 of an extension of a gate structure 260 outward from underneath a corresponding channel layer 270. The length L4 may be in the x-direction in the semiconductor device 200, which may correspond to a horizontal direction in the semiconductor device 200 along the word line conductive structures 258. In some implementations, the length L4 is included in a range of approximately 10 nanometers to approximately 60 nanometers. However, other values for the range are within the scope of the present disclosure. The length L4 may be greater relative to the length L2.

As indicated above, FIGS. 5A and 5B are provided as examples. Other examples may differ from what is described with regard to FIGS. 5A and 5B.

FIGS. 6A-6M are diagrams of an example implementation 600 described herein. The example implementation 600 may include an example process for forming the volatile memory array 202*a* and the non-volatile memory array 202*b* in the back end region of the semiconductor device 200.

Figure 6A:
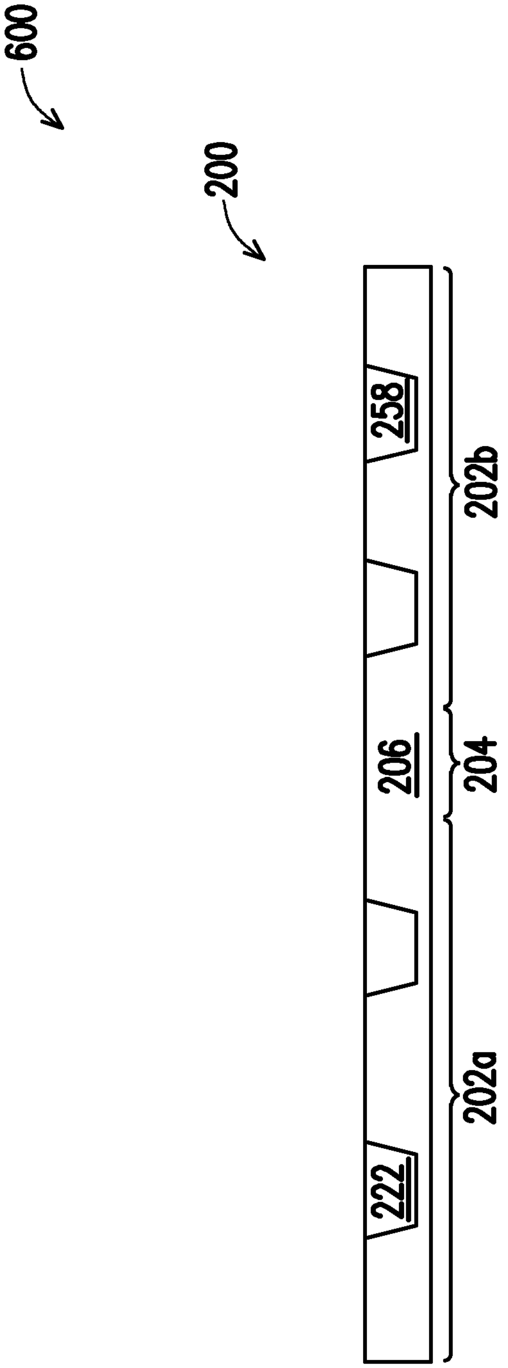
FIGS. 6A-6M are diagrams of an example implementation described herein.

As shown in FIG. 6A, the dielectric layer 206 may be formed. The deposition tool 102 may deposit the dielectric layer 206 using a CVD technique, a PVD technique, an ALD technique, another deposition technique described above in connection with FIG. 1, and/or a deposition technique other than as described above in connection with FIG. 1.

As further shown in FIG. 6A, the word line conductive structures 222 may be formed in dielectric layer 206 in the volatile memory array 202*a*. Moreover, the word line conductive structures 258 may be formed in dielectric layer 206 in the non-volatile memory array 202*b*.

In some implementations, a pattern in a photoresist layer is used to form recesses in the dielectric layer 206. In these implementations, the deposition tool 102 forms the photoresist layer on the dielectric layer 206. The exposure tool 104 exposes the photoresist layer to a radiation source to pattern the photoresist layer. The developer tool 106 develops and removes portions of the photoresist layer to expose the pattern. The etch tool 108 etches into the dielectric layer 206 to form the recesses. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recesses based on a pattern.

The deposition tool 102 and/or the plating tool 112 may deposit the word line conductive structures 222 and 258 in the recesses using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the word line conductive structures 222 and 258 after the word line conductive structures 222 and 258 are deposited.

Figure 6B:
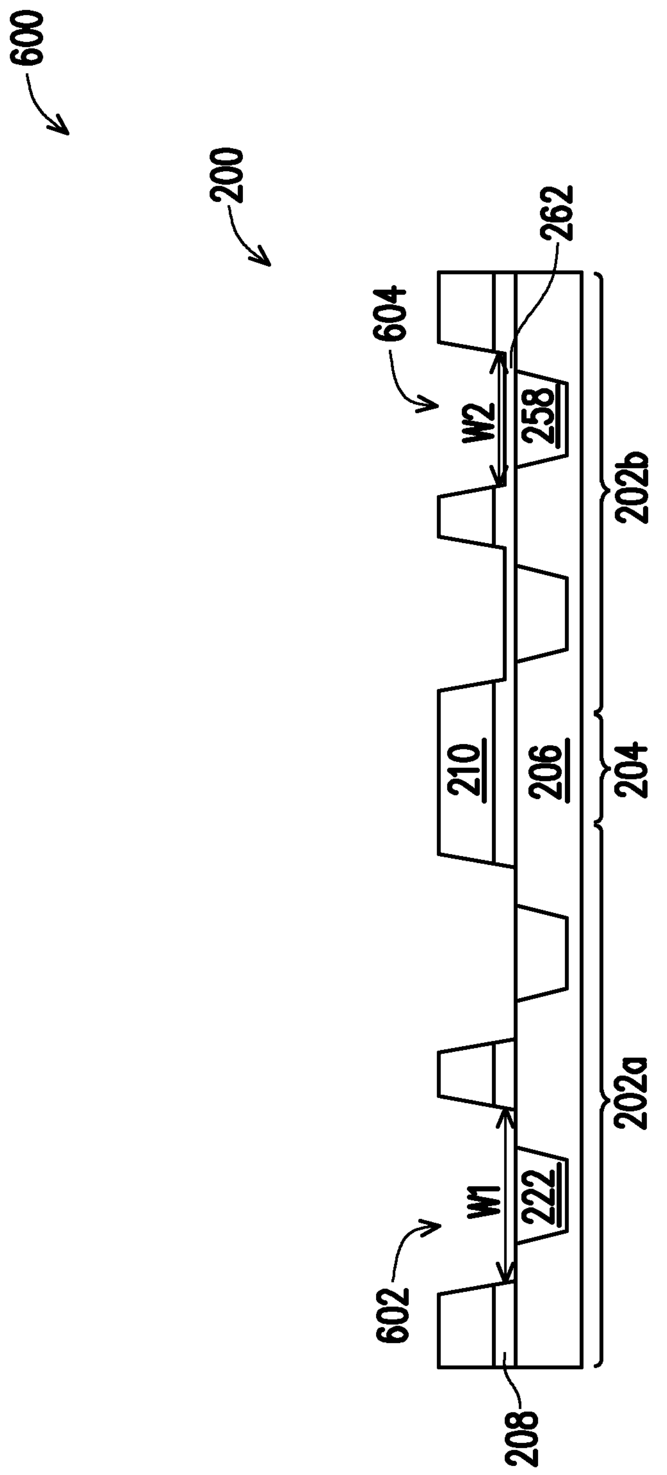

As shown in FIG. 6B, the dielectric layer 208 may be formed over and/or on the dielectric layer 206, and over and/or on the word line conductive structures 222 and 258. Moreover, the dielectric layer 210 (or a portion thereof) may be formed over and/or on the dielectric layer 208. The deposition tool 102 may deposit the dielectric layer 208 and the dielectric layer 210 using a CVD technique, a PVD technique, an ALD technique, another deposition technique described above in connection with FIG. 1, and/or a deposition technique other than as described above in connection with FIG. 1.

As further shown in FIG. 6B, recesses 602 may be formed in and/or through the dielectric layers 208 and 210 in the volatile memory array 202*a*. Similarly, recesses 604 may be formed in and/or through the dielectric layers 208 and 210 in the non-volatile memory array 202*b*.

In particular, the recesses 602 may be formed over the word line conductive structures 222. The recesses 602 may be formed fully through the dielectric layers 208 and 210 such that the top surfaces of the word line conductive structures 222 are exposed through the recesses 602. The recesses 604 may be formed over the word line conductive structures 258. Unlike the recesses 602, the recesses 604 may be formed fully through the dielectric layer 210 and into a portion of the dielectric layer 208 (e.g., not fully through the dielectric layer 208) such that the top surfaces of the word line conductive structures 258 are not exposed through the recesses 604. Instead, portions 262 of the dielectric layer 208 remain over the top surfaces of the word line conductive structures 258.

In some implementations, the recesses 602 and the recesses 604 are formed in the same etch operation (or in the same set of etch operations) without additional masking. This reduces the semiconductor processing cost and complexity for forming both of the volatile memory array 202*a* and the non-volatile memory array 202*b* in the back end region of the semiconductor device 200. The recesses 604 may be formed to the width W2 that is lesser relative to the width W1 of the recesses 602, which results in under etching of the recesses 604. The under etching occurs because of the lesser amount of surface area in the recesses 604 that etchant can contact and remove material from relative to the recesses 602. This results in a slower etch rate in the recesses 604 relative to the recesses 602. The faster etch rate in the recesses 602 enables the recesses 602 to be fully etch through the dielectric layers 208 and 210. The thickness of the dielectric layer 208 may be included in a range of approximately 60 angstroms to approximately 500 angstroms, whereas the thickness of the portion 262 of the dielectric layer 208 may be included in a range of approximately 30 angstroms to approximately 150 angstroms. However, other values for these ranges are within the scope of the present disclosure.

In some implementations, a pattern in a photoresist layer is used to form the recesses 602 and 604 in the dielectric layers 208 and 210. In these implementations, the deposition tool 102 forms the photoresist layer on the dielectric layer 210. The exposure tool 104 exposes the photoresist layer to a radiation source to pattern the photoresist layer. The developer tool 106 develops and removes portions of the photoresist layer to expose the pattern. The etch tool 108 etches into the dielectric layers 208 and 210 to form the recesses 602 and 604. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recesses 602 and 604 based on a pattern.

Figure 6C:
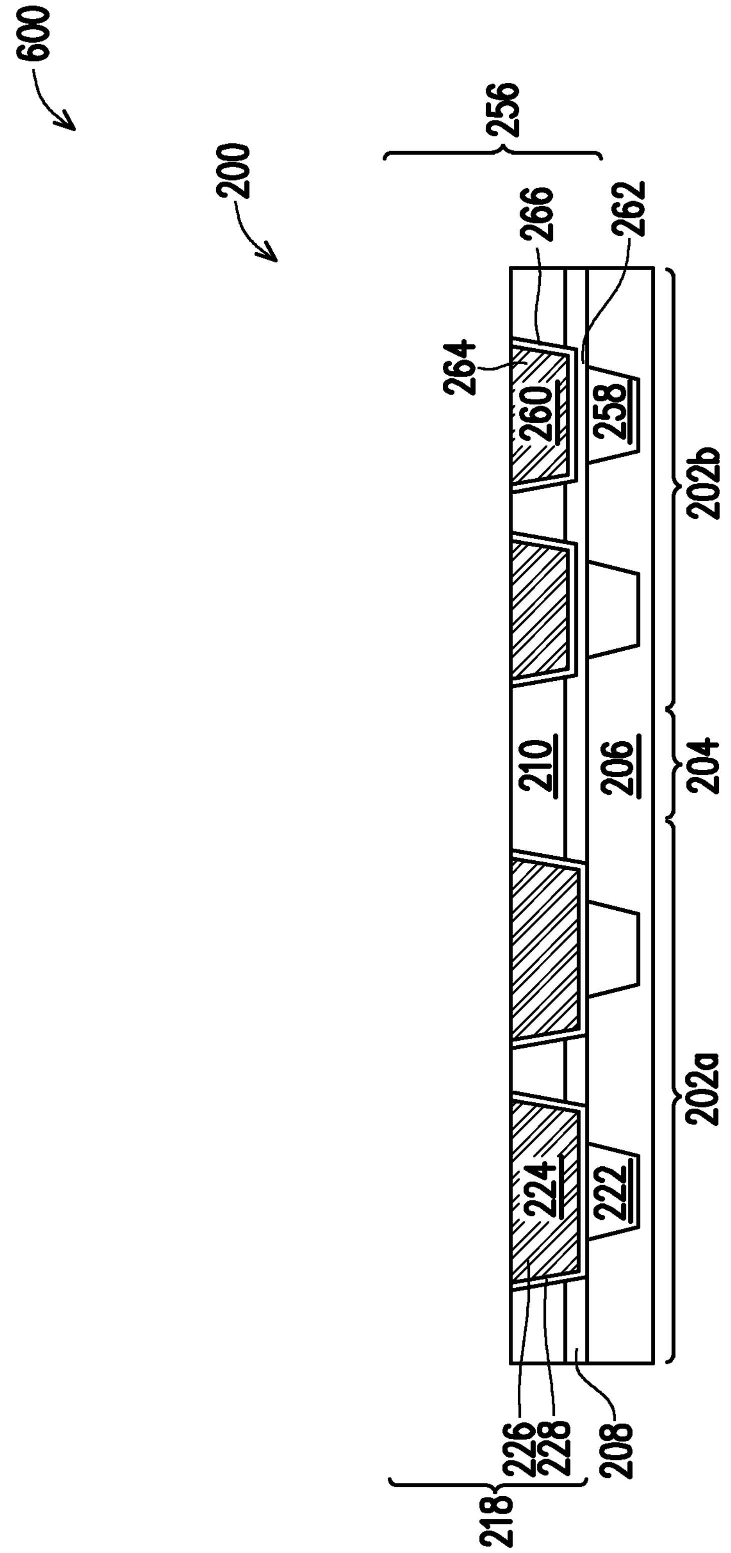

As shown in FIG. 6C, the gate structures 224 may be formed in the recesses 602 over the word line conductive structures 222 in the volatile memory array 202*a*. Moreover, the gate structures 260 may be formed in the recesses 604 over the word line conductive structures 258 in the non-volatile memory array 202*b*. The gate structures 224 are formed directly on the word line conductive structures 222 such that the gate structures 224 and the word line conductive structures 222 are in direct physical contact. The gate structures 260 are formed on the portions 262 of the dielectric layer 208 such that the gate structures 260 and the word line conductive structures 258 are not in direct physical contact and are instead separated or spaced apart by the portions 262 of the dielectric layer 208.

To form the gate structures 224, the deposition tool 102 and/or the plating tool 112 may deposit the liner layer(s) 228 in the recesses 602 using a CVD technique, a PVD technique, an ALD technique, an electroplating technique, another deposition technique described above in connection with FIG. 1, and/or a deposition technique other than as described above in connection with FIG. 1. The deposition tool 102 and/or the plating tool 112 may deposit the gate electrode 226 over and/or on the liner layer(s) 228 in the recesses 602 using a CVD technique, a PVD technique, an ALD technique, an electroplating technique, another deposition technique described above in connection with FIG. 1, and/or a deposition technique other than as described above in connection with FIG. 1.

To form the gate structures 260, the deposition tool 102 and/or the plating tool 112 may deposit the liner layer(s) 266 in the recesses 604 using a CVD technique, a PVD technique, an ALD technique, an electroplating technique, another deposition technique described above in connection with FIG. 1, and/or a deposition technique other than as described above in connection with FIG. 1. The deposition tool 102 and/or the plating tool 112 may deposit the gate electrode 264 over and/or on the liner layer(s) 266 in the recesses 604 using a CVD technique, a PVD technique, an ALD technique, an electroplating technique, another deposition technique described above in connection with FIG. 1, and/or a deposition technique other than as described above in connection with FIG. 1.

Figure 6D:
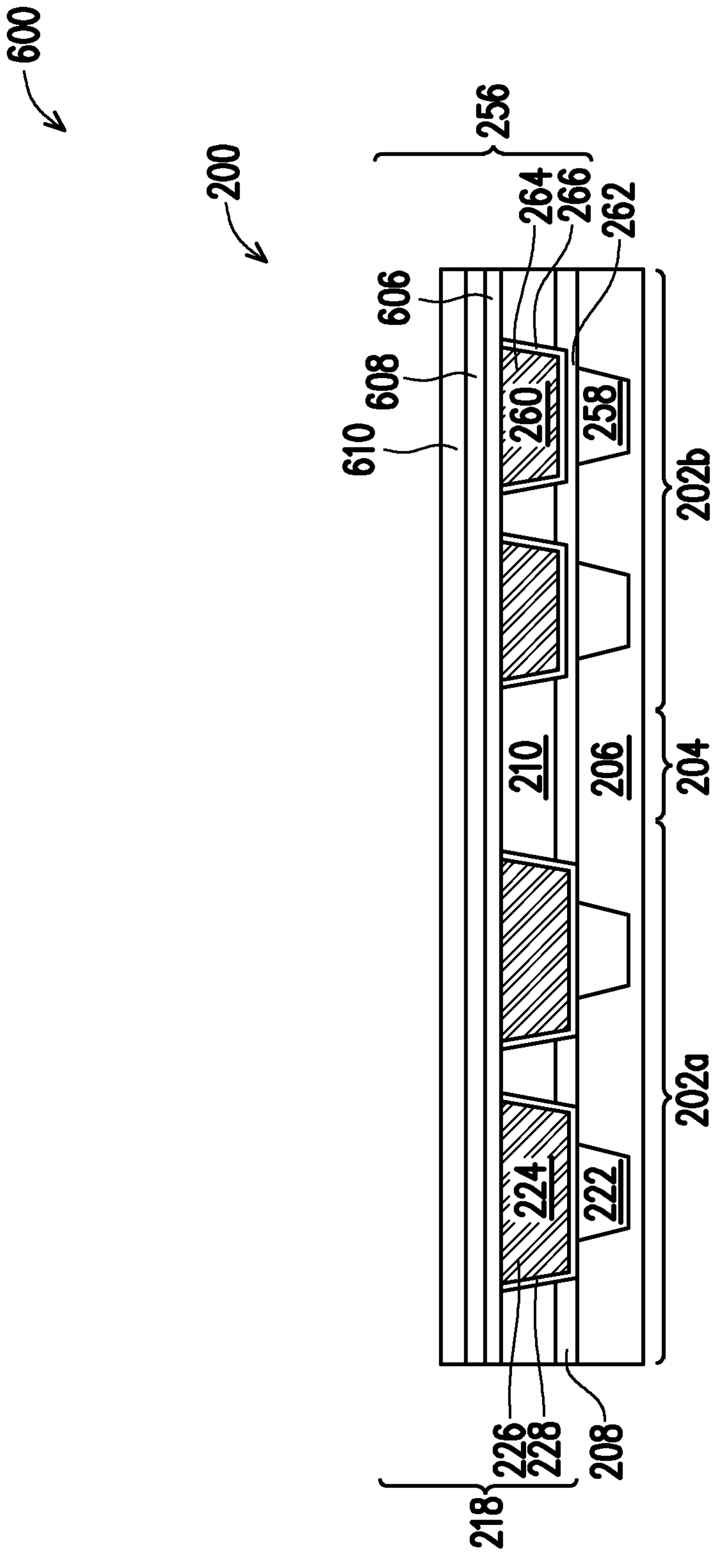

As shown in FIG. 6D, a plurality of layers may be formed over and/or on the dielectric layer 210 and over and/or on the gate structures 224 and 260. For example, a dielectric layer 606 may be formed over and/or on the dielectric layer 210 and over and/or on the gate structures 224 and 260. As another example, a channel material layer 608 may be formed over and/or on the dielectric layer 606. As another example, a dielectric layer 610 may be formed over and/or on the channel material layer 608. The deposition tool 102 may deposit the dielectric layer 606, the channel material layer 608, and the dielectric layer 610 using a CVD technique, a PVD technique, an ALD technique, another deposition technique described above in connection with FIG. 1, and/or a deposition technique other than as described above in connection with FIG. 1.

Figure 6E:
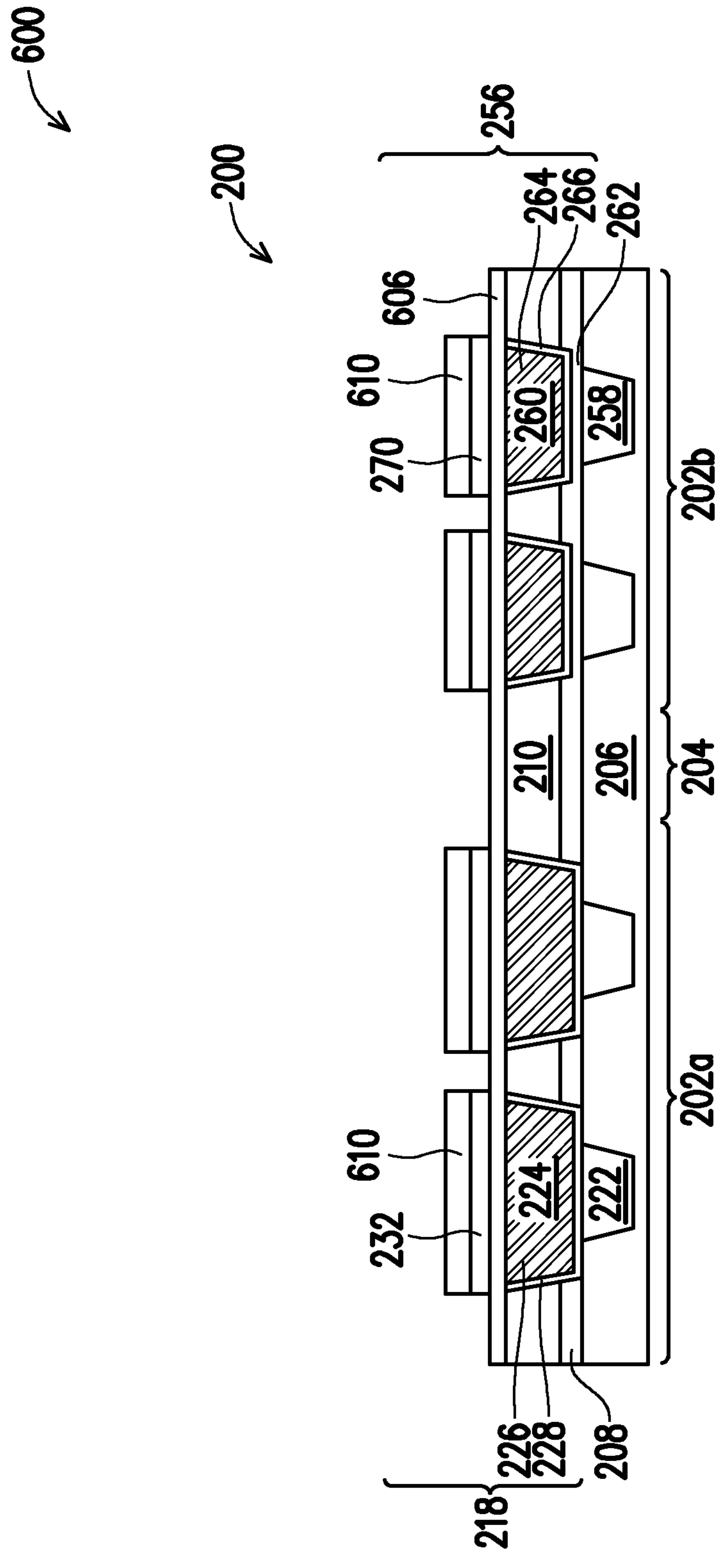

As further shown in FIG. 6E, an etch operation may be performed to remove portions of the channel material layer 608 and the dielectric layer 610 to form the channel layers 232 and the channel layers 270 from the channel material layer 608. The channel layers 232 may be formed over the gate structures 224, and the channel layers 270 may be formed over the gate structures 260.

In some implementations, a pattern in a photoresist layer is used to form the channel layers 232 and the channel layers 270. In these implementations, the deposition tool 102 forms the photoresist layer on the dielectric layer 610. The exposure tool 104 exposes the photoresist layer to a radiation source to pattern the photoresist layer. The developer tool 106 develops and removes portions of the photoresist layer to expose the pattern. The etch tool 108 etches through the dielectric layer 610 and through the channel material layer 608. The remaining portions of the channel material layer 608 over the gate structures 224 correspond to the channel layers 232, and remaining portions of the channel material layer 608 over the gate structures 260 correspond to the channel layers 270. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the channel layers 232 and 270 based on a pattern.

In some implementations, the thickness of the channel layers 232 and the channel layers 270 is included in a range of approximately 3 nanometers to approximately 15 nanometers to achieve a sufficiently high current while achieving sufficient gate control and a sufficiently low leakage current. However, other values for the range are within the scope of the present disclosure. In some implementations, the channel layers 232 and the channel layers 270 are formed to different thicknesses. In some implementations, the width of the channel layers 232 and the channel layers 270 is included in a range of approximately 30 nanometers to approximately 300 nanometers. In some implementations, the width of the channel layers 232 is included in a range of approximately 30 nanometers to approximately 200 nanometers, and the channel layers 270 is included in a range of approximately 20 nanometers to approximately 190 nanometers. However, other values for these ranges are within the scope of the present disclosure. In some implementations, the spacing between transistor structures 218 and the spacing between non-volatile memory cell structures 256 is a same spacing. In some implementations, the spacing between transistor structures 218 and the spacing between non-volatile memory cell structures 256 are different spacings. In some implementations, the spacing between non-volatile memory cell structures 256 is included in a range of approximately 10 nanometers to approximately 500 nanometers to achieve sufficient isolation between non-volatile memory cell structures 256 while achieving a sufficiently high density of non-volatile memory cell structures 256 in the semiconductor device 200. However, other values for the range are within the scope of the present disclosure.

Figure 6F:
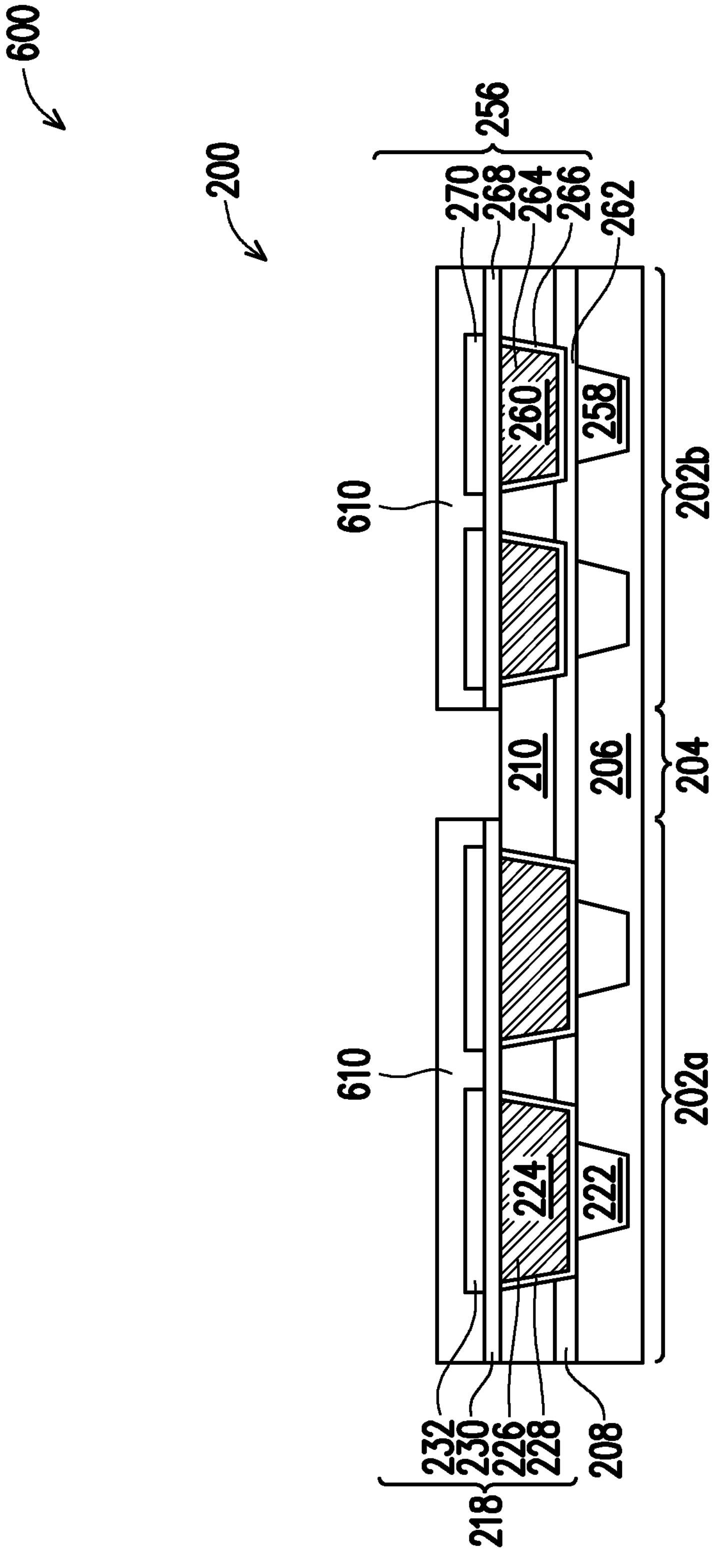

As shown in FIG. 6F, additional dielectric material for the dielectric layer 610 may be deposited in the volatile memory array 202*a* and in the non-volatile memory array 202*b*. The deposition tool 102 may deposit the additional dielectric material for the dielectric layer 610 using a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the dielectric layer 610.

The etch tool 108 may etch back portions of the dielectric layer 610 and portions of the dielectric layer 606 to define the non-array region 204. The etch back results in formation of the gate dielectric layer 230 in the volatile memory array 202*a* and the gate dielectric layer 268 in the non-volatile memory array 202*b*. The use of high-k dielectric materials may be a relatively uncommon practice in the back end region of semiconductor device. Residual high-k dielectric materials in the non-array region 204 may result in contamination of one or more of the semiconductor processing tools 102-112 in one or more subsequent processes associated with the back end region of the semiconductor device 200. Accordingly, the etch tool 108 may remove the portions of the dielectric layer 606 in the non-array region 204 to reduce the likelihood of high-k dielectric contamination in the non-array region 204.

Figure 6G:
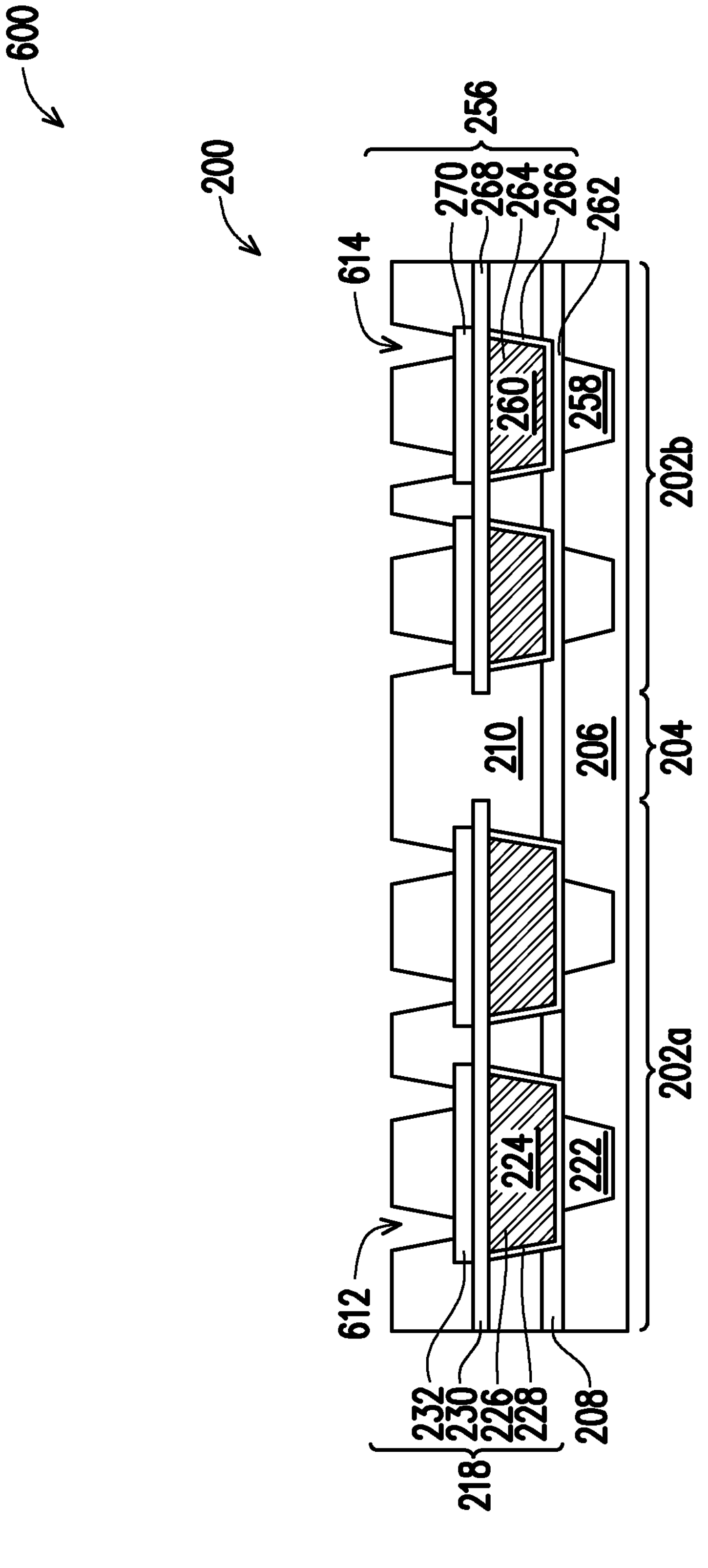

As shown in FIG. 6G, additional dielectric material may be deposited in semiconductor device. The combination of the additional material, the dielectric layer 210 and the dielectric layer 610 may be referred to as the dielectric layer 210. The deposition tool 102 may deposit the additional dielectric material using a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the dielectric layer 210.

As further shown in FIG. 6G, recesses 612 may be formed in the dielectric layer 210 over and to the channel layers 232. Recesses 614 may be formed in the dielectric layer 210 over and to the channel layers 270. In some implementations, a pattern in a photoresist layer is used to form the recesses 612 and 614 in the dielectric layer 210. In these implementations, the deposition tool 102 forms the photoresist layer on the dielectric layer 210. The exposure tool 104 exposes the photoresist layer to a radiation source to pattern the photoresist layer. The developer tool 106 develops and removes portions of the photoresist layer to expose the pattern. The etch tool 108 etches into the dielectric layer 210 to form the recesses 612 and 614. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recesses 612 and 614 based on a pattern.

Figure 6H:
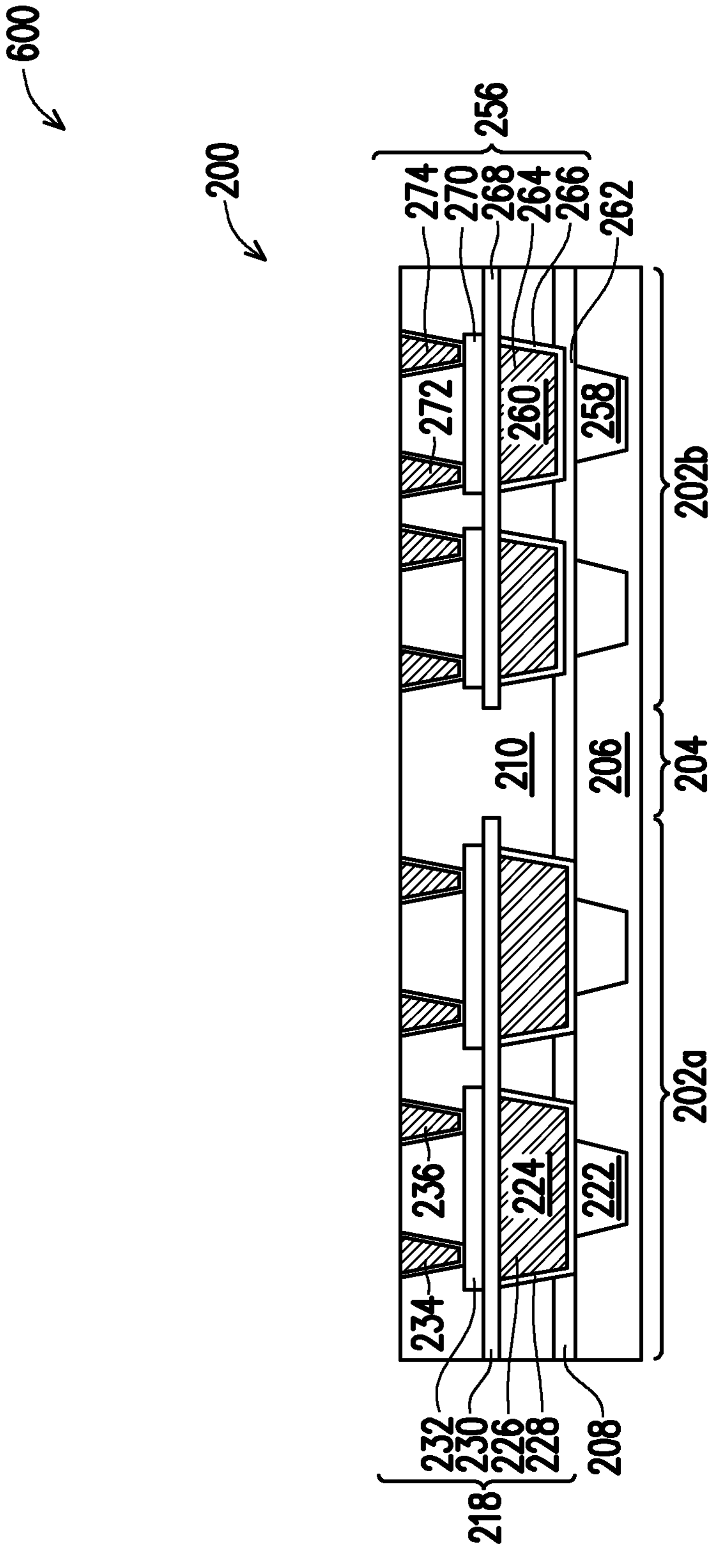

As shown in FIG. 6H, source/drain regions 234 and 236 may be formed in the recesses 612. The source/drain regions 234 and 236 may be coupled with the channel layers 232. Source/drain regions 272 and 274 may be formed in the recesses 614. The source/drain regions 272 and 274 may be coupled with the channel layers 270.

The deposition tool 102 may deposit the source/drain regions 234, 236, 272, and 274 using an epitaxy technique, CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the source/drain regions 234, 236, 272, and 274. In some implementations, one or more liner layers are deposited in the recesses 612 and 614 prior to formation of the source/drain regions 234, 236, 272, and 274 to promote adhesion between the dielectric layer 210 and the source/drain regions 234, 236, 272, and 274, and to reduce dopant diffusion into the dielectric layer 210 from the source/drain regions 234, 236, 272, and 274.

Figure 6I:
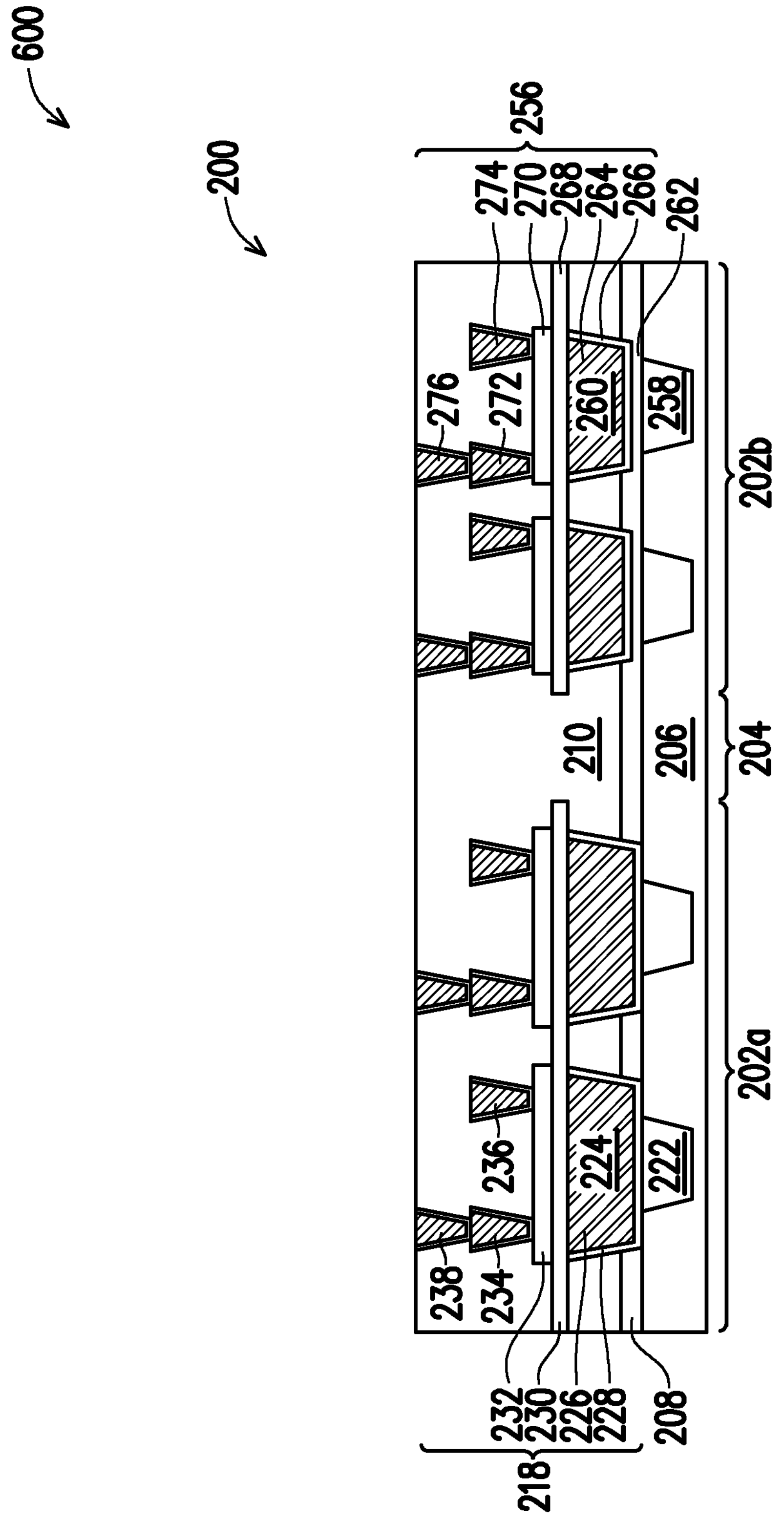

As shown in FIG. 6I, additional dielectric material may be deposited for the dielectric layer 210. The deposition tool 102 may deposit the additional dielectric material using a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the dielectric layer 210.

As further shown in FIG. 6I, interconnect structures 238 and 276 may be formed in the dielectric layer 210. The interconnect structures 238 may be formed over and/or on the source/drain regions 234 such that the interconnect structures 238 are coupled with the source/drain regions 234. The interconnect structures 276 may be formed over and/or on the source/drain regions 272 such that the interconnect structures 276 are coupled with the source/drain regions 272.

In some implementations, a pattern in a photoresist layer is used to form recesses in the dielectric layer 210 over and to the source/drain regions 234 and 272. In these implementations, the deposition tool 102 forms the photoresist layer on the dielectric layer 210. The exposure tool 104 exposes the photoresist layer to a radiation source to pattern the photoresist layer. The developer tool 106 develops and removes portions of the photoresist layer to expose the pattern. The etch tool 108 etches into the dielectric layer 210 to form the recesses. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recesses based on a pattern.

The deposition tool 102 and/or the plating tool 112 may deposit the interconnect structures 238 and 276 in the recesses using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the interconnect structures 238 and 276. In some implementations, one or more liner layers are deposited in the recesses prior to formation of the interconnect structures 238 and 276 to promote adhesion between the dielectric layer 210 and the interconnect structures 238 and 276, and to reduce electron migration into the dielectric layer 210 from the interconnect structures 238 and 276.

Figure 6J:
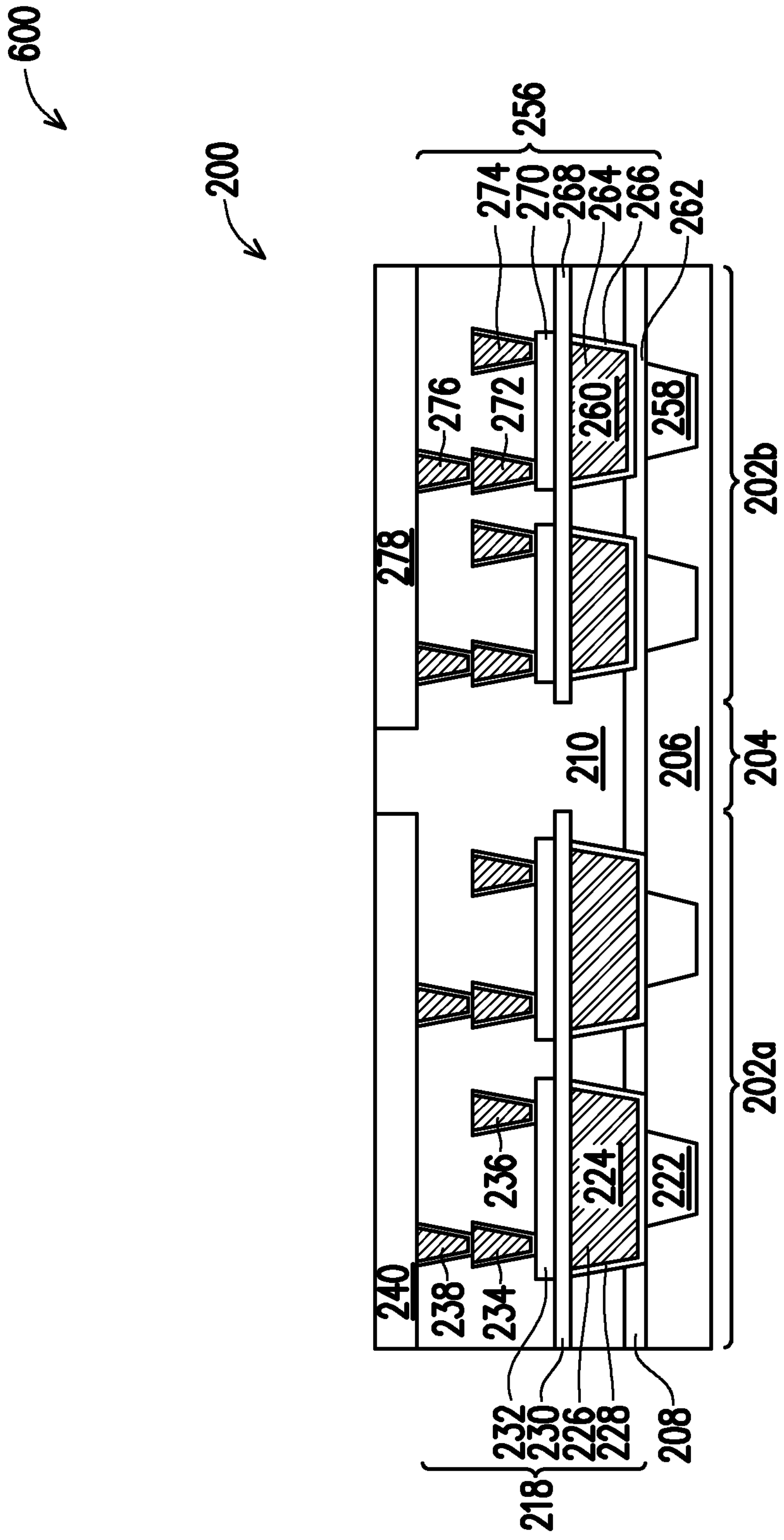

As shown in FIG. 6J, additional dielectric material may be deposited for the dielectric layer 210. The deposition tool 102 may deposit the additional dielectric material using a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the dielectric layer 210.

As further shown in FIG. 6J, bit line conductive structures 240 and 278 may be formed on the dielectric layer 210. The bit line conductive structure 240 may be formed over and/or on the interconnect structures 238 such that the interconnect structures 238 are coupled with the bit line conductive structure 240. The bit line conductive structure 278 may be formed over and/or on the interconnect structures 276 such that the interconnect structures 276 are coupled with the bit line conductive structure 278.

In some implementations, a pattern in a photoresist layer is used to form recesses in the dielectric layer 210. In these implementations, the deposition tool 102 forms the photoresist layer on the dielectric layer 210. The exposure tool 104 exposes the photoresist layer to a radiation source to pattern the photoresist layer. The developer tool 106 develops and removes portions of the photoresist layer to expose the pattern. The etch tool 108 etches into the dielectric layer 210 to form the recesses. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recesses based on a pattern.

The deposition tool 102 and/or the plating tool 112 may deposit the bit line conductive structures 240 and 278 in the recesses using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the bit line conductive structures 240 and 278.

Figure 6K:
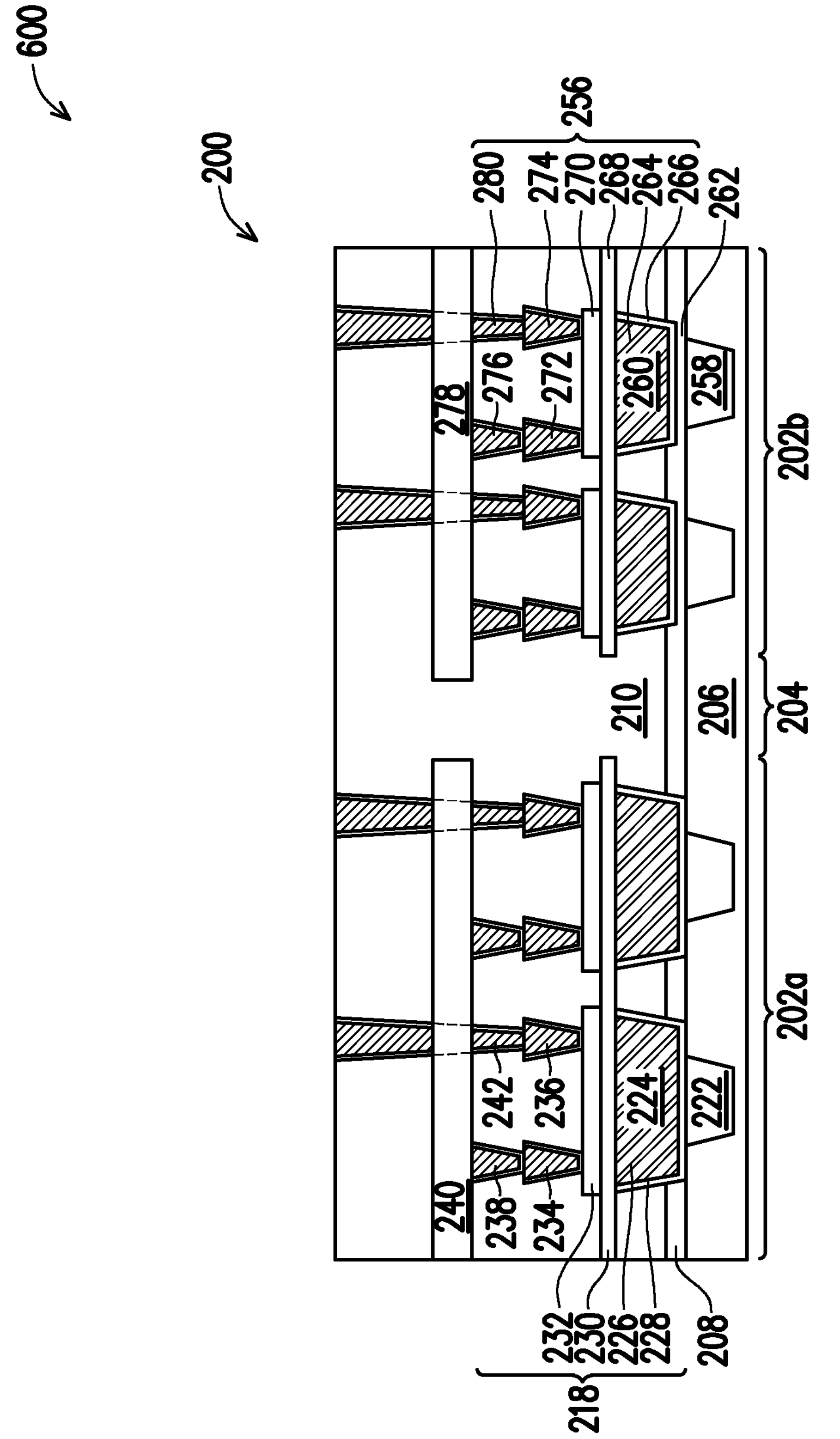

As shown in FIG. 6K, additional dielectric material may be deposited for the dielectric layer 210. The deposition tool 102 may deposit the additional dielectric material using a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the dielectric layer 210.

As further shown in FIG. 6K, interconnect structures 242 and 280 may be formed in the dielectric layer 210. The interconnect structures 242 may be formed over and/or on the source/drain regions 236 such that the interconnect structures 242 are coupled with the source/drain regions 236. The interconnect structures 280 may be formed over and/or on the source/drain regions 274 such that the interconnect structures 280 are coupled with the source/drain regions 274.

In some implementations, a pattern in a photoresist layer is used to form recesses in the dielectric layer 210 over and to the source/drain regions 236 and 274. In these implementations, the deposition tool 102 forms the photoresist layer on the dielectric layer 210. The exposure tool 104 exposes the photoresist layer to a radiation source to pattern the photoresist layer. The developer tool 106 develops and removes portions of the photoresist layer to expose the pattern. The etch tool 108 etches into the dielectric layer 210 to form the recesses. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recesses based on a pattern.

The deposition tool 102 and/or the plating tool 112 may deposit the interconnect structures 242 and 280 in the recesses using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the interconnect structures 242 and 280. In some implementations, one or more liner layers are deposited in the recesses prior to formation of the interconnect structures 242 and 280 to promote adhesion between the dielectric layer 210 and the interconnect structures 242 and 280, and to reduce electron migration into the dielectric layer 210 from the interconnect structures 242 and 280.

Figure 6L:
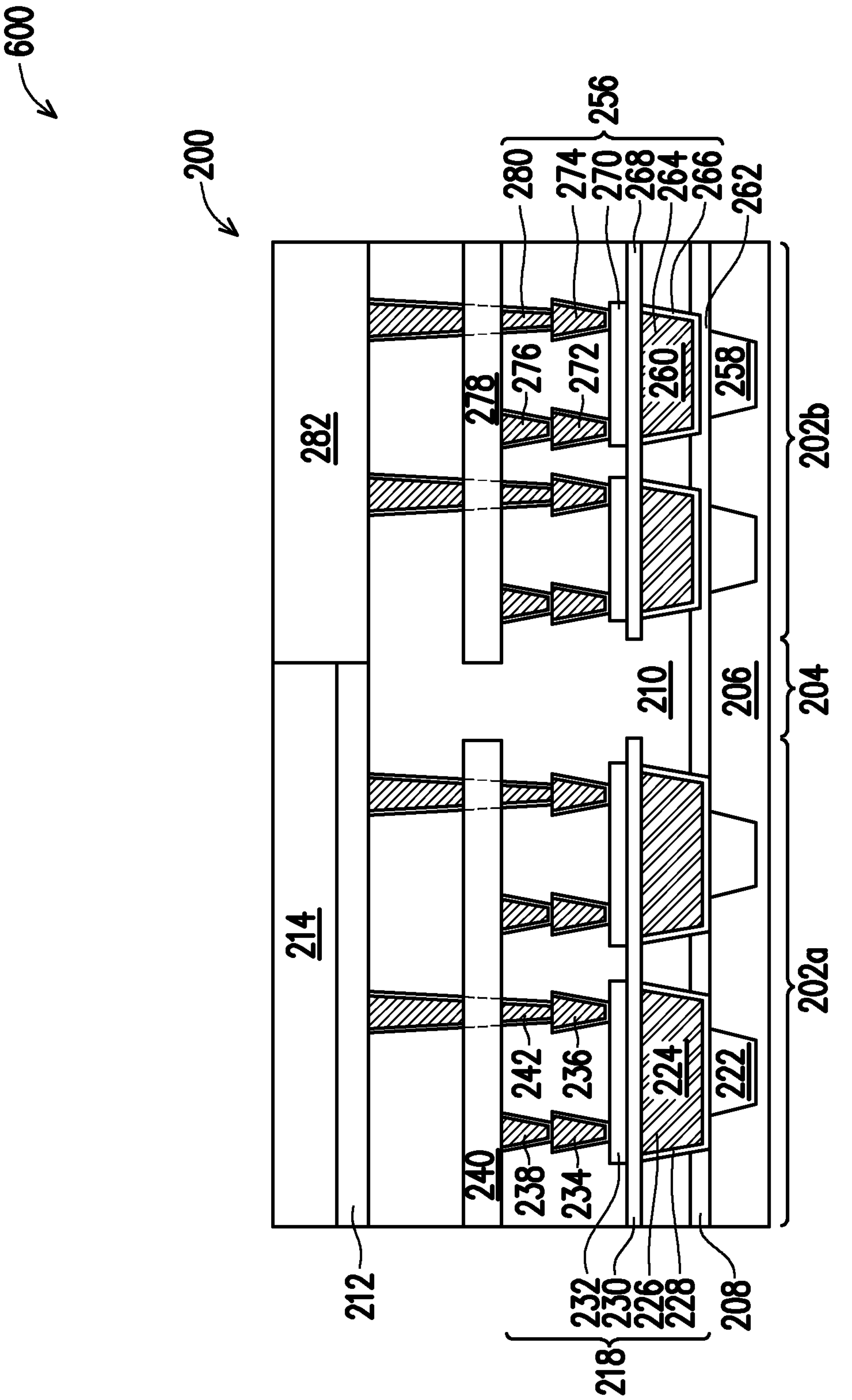

As shown in FIG. 6L, the dielectric layer 212 is formed over and/or on the dielectric layer 210, over and/or on the interconnect structures 242, and/or over and/or on the interconnect structures 280. The dielectric layer 214 may be formed over and/or on the dielectric layer 212. The deposition tool 102 may deposit the dielectric layers 212 and 214 using a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the dielectric layers 212 and 214.

As further shown in FIG. 6L, the select line conductive structure 282 may be formed in the dielectric layers 212 and 214. The select line conductive structure 282 may be formed over and/or on the interconnect structures 280 such that the select line conductive structure 282 is coupled with the interconnect structures 280.

In some implementations, a pattern in a photoresist layer is used to form a recess in the dielectric layers 214 and 212. In these implementations, the deposition tool 102 forms the photoresist layer on the dielectric layer 210. The exposure tool 104 exposes the photoresist layer to a radiation source to pattern the photoresist layer. The developer tool 106 develops and removes portions of the photoresist layer to expose the pattern. The etch tool 108 etches into the dielectric layers 212 and 214 to form the recess. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recess based on a pattern.

The deposition tool 102 and/or the plating tool 112 may deposit the select line conductive structure 282 in the recesses using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the select line conductive structure 282.

Figure 6M:
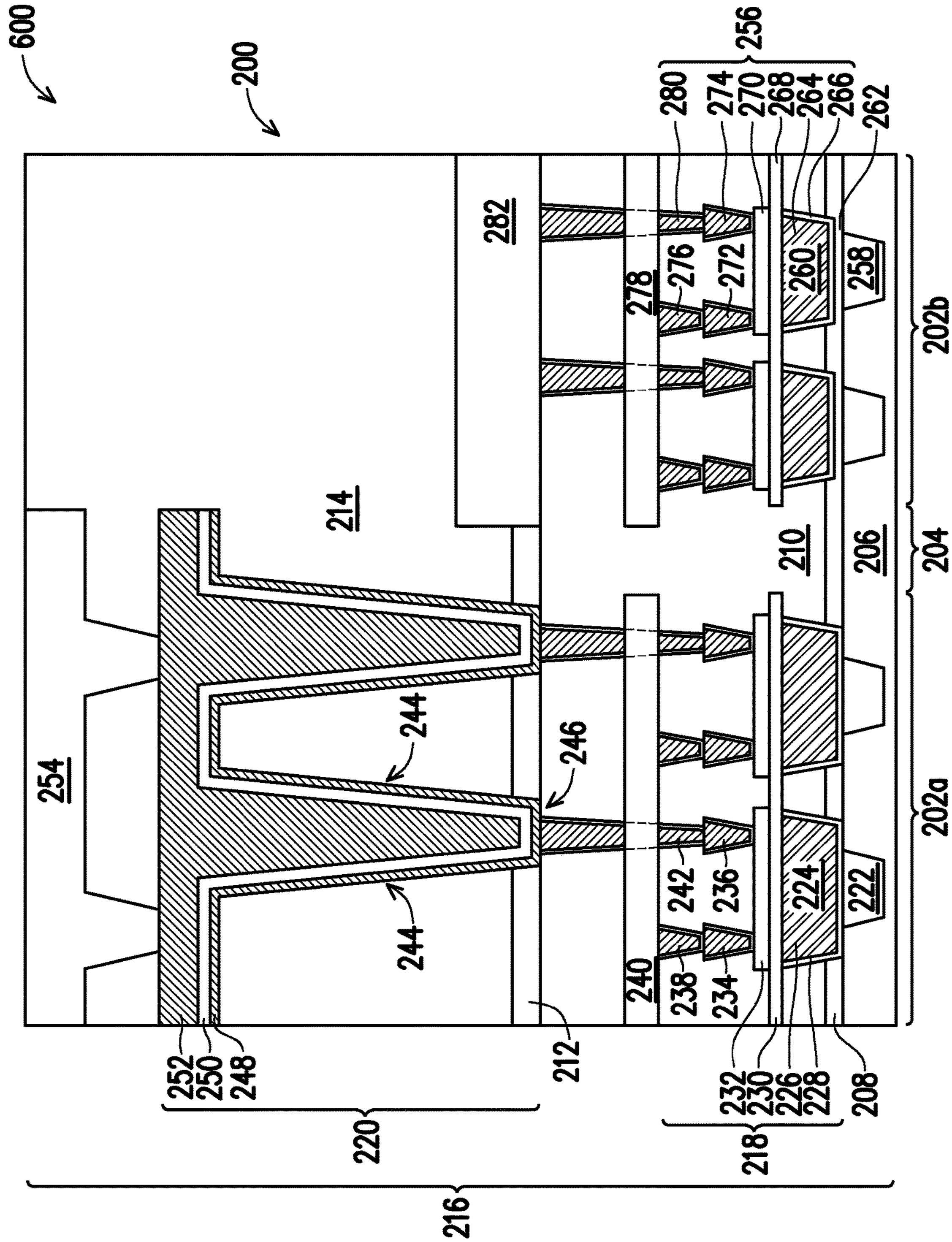

As shown in FIG. 6M, additional dielectric material may be deposited for the dielectric layer 214. The deposition tool 102 may deposit the additional dielectric material using a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the dielectric layer 214.

As further shown in FIG. 6M, capacitor structures 220 may be formed in the volatile memory array 202*a* for the volatile memory cell structures 216 of the volatile memory array 202*a*. The capacitor structures 220 may be coupled with the transistors of the volatile memory cell structures 216 through the interconnect structures 242.

In some implementations, a pattern in a photoresist layer is used to form recesses in the dielectric layers 212 and 214 over and to the interconnect structures 242. In these implementations, the deposition tool 102 forms the photoresist layer on the dielectric layer 214. The exposure tool 104 exposes the photoresist layer to a radiation source to pattern the photoresist layer. The developer tool 106 develops and removes portions of the photoresist layer to expose the pattern. The etch tool 108 etches into the dielectric layers 212 and 214 to form the recesses. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recesses based on a pattern.

The deposition tool 102 and/or the plating tool 112 may deposit the conductive layer 248, the dielectric layer 250, and the conductive layer 252 in the recesses using a CVD technique, a PVD technique, an ALD technique, an electroplating technique, another deposition technique described above in connection with FIG. 1, and/or a deposition technique other than as described above in connection with FIG. 1.

Additional dielectric material may be deposited for the dielectric layer 214 after formation of the capacitor structures 220. The deposition tool 102 may deposit the additional dielectric material using a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the dielectric layer 214.

As further shown in FIG. 6M, the ground conductive structure 254 may be formed in the dielectric layer 214. The ground conductive structure 254 may be formed over and/or on the capacitor structures 220 such that the ground conductive structure 254 is coupled with the capacitor structures 220.

In some implementations, a pattern in a photoresist layer is used to form a recess in the dielectric layer 214. In these implementations, the deposition tool 102 forms the photoresist layer on the dielectric layer 214. The exposure tool 104 exposes the photoresist layer to a radiation source to pattern the photoresist layer. The developer tool 106 develops and removes portions of the photoresist layer to expose the pattern. The etch tool 108 etches into the dielectric layer 214 to form the recess. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recess based on a pattern.

The deposition tool 102 and/or the plating tool 112 may deposit the ground conductive structure 254 in the recess using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the ground conductive structure 254.

As indicated above, FIGS. 6A-6M are provided as an example. Other examples may differ from what is described with regard to FIGS. 6A-6M.

Figure 7:
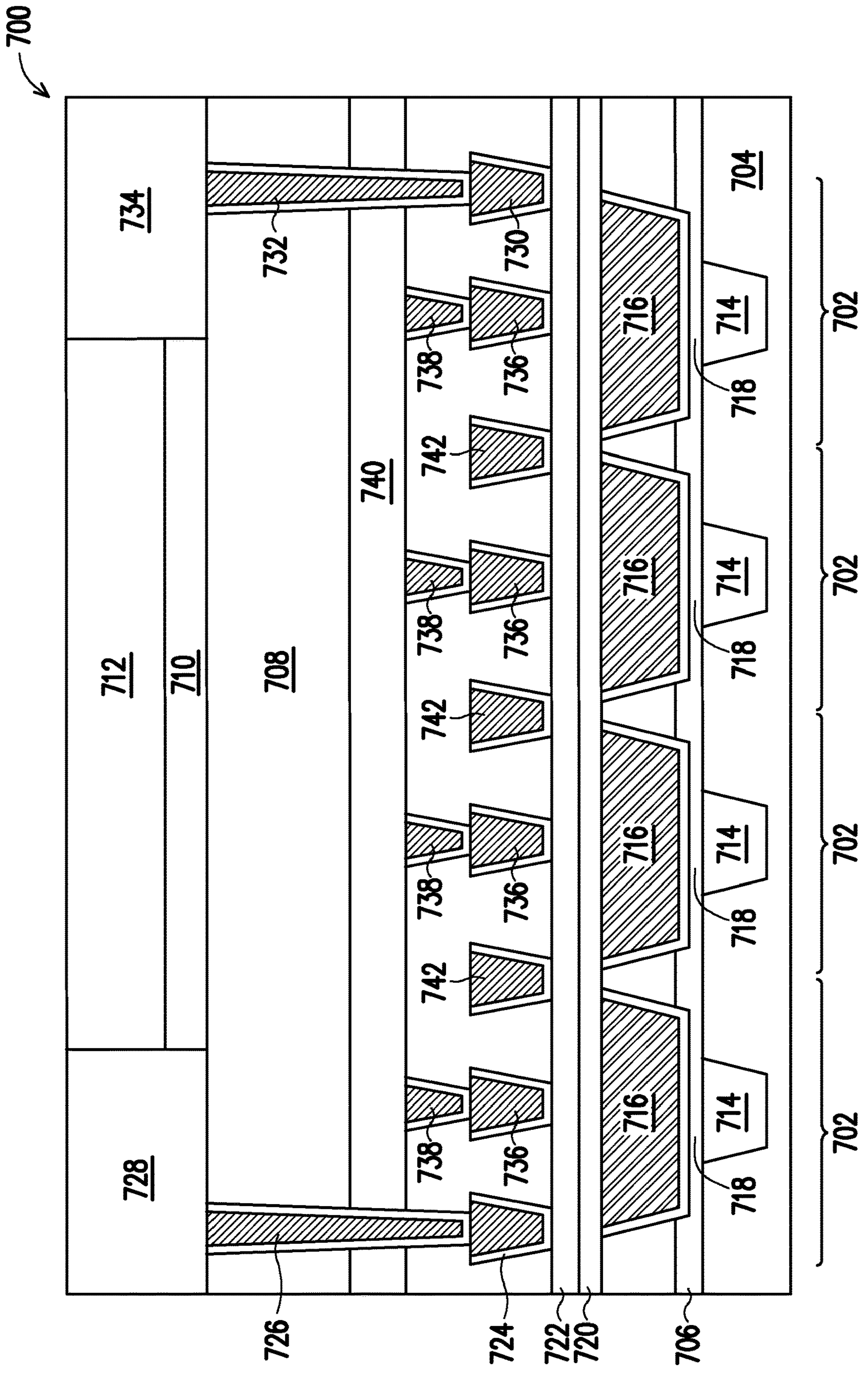
FIG. 7 is a diagram of an example semiconductor device described herein.

FIG. 7 is a diagram of an example semiconductor device 700 described herein. The semiconductor device 700 includes an example of a portion of a neural network circuit, such as an artificial neural network circuit or deep neural network circuit, in which the nodes of the neural network are implemented as floating gate structures 702. The neural network may be included in a back end region or BEOL region of the semiconductor device 700.

As shown in FIG. 7, each of the floating gate structures 702 includes a similar configuration as a non-volatile memory cell structure 256 described herein. The floating gate structures 702 may be included in a plurality of dielectric layers 704-712, which may correspond to the dielectric layers 206-214. The floating gate structures 702 may be connected in series to form an artificial neural network or deep neural network.

As further shown in FIG. 7, each floating gate structure 702 may include a word line conductive structure 714, a gate structure 716, a portion 718 of the dielectric layer 706 between the word line conductive structure 714 and the gate structure 716, a gate dielectric layer 720, and a channel layer 722. The gate structures 716 are separated by portions 718 of the dielectric layer 706 such that the gate structures 716 are floating gates. The gate dielectric layer 720 may be included over and/or on the gate structures 716 of the floating gate structures 702, and may extend continuously over the gate structures 716. The channel layer 722 may be included over and/or on the gate dielectric layer 720, and may extend continuously over the gate dielectric layer 720 across the gate structures 716, as shown in the example in FIG. 7.

A floating gate structure 702 at a first end of the series chain of floating gate structures 702 may include an input source/drain region 724 that is coupled with an interconnect structure 726 that extends through the dielectric layer 708. The interconnect structure 726 is coupled with a read bit line conductive structure 728. Accordingly, the floating gate structure 702 at the first end of the series chain of floating gate structures 702 is electrically coupled with the read bit line conductive structure 728 through the input source/drain region 724 and the interconnect structure 726.

A floating gate structure 702 at a second end of the series chain of floating gate structures 702 opposing the first end may include an output source/drain region 730 that is coupled with an interconnect structure 732 that extends through the dielectric layer 708. The interconnect structure 732 is coupled with a select line conductive structure 734. Accordingly, the floating gate structure 702 at the second end of the series chain of floating gate structures 702 is electrically coupled with the select line conductive structure 734 through the output source/drain region 730 and the interconnect structure 732.

As further shown in FIG. 7, the channel layer 722 of the floating gate structures 702 may be coupled with source/drain regions 736, which are coupled with interconnect structures 738. The source/drain regions 736 and the interconnect structures 738 electrically couple the floating gate structures 702 with a write bit line conductive structure 740. Source/drain regions 742 electrically couple the floating gate structures 702 in series.

As indicated above, FIG. 7 is provided as an example. Other examples may differ from what is described with regard to FIG. 7.

Figure 8A:
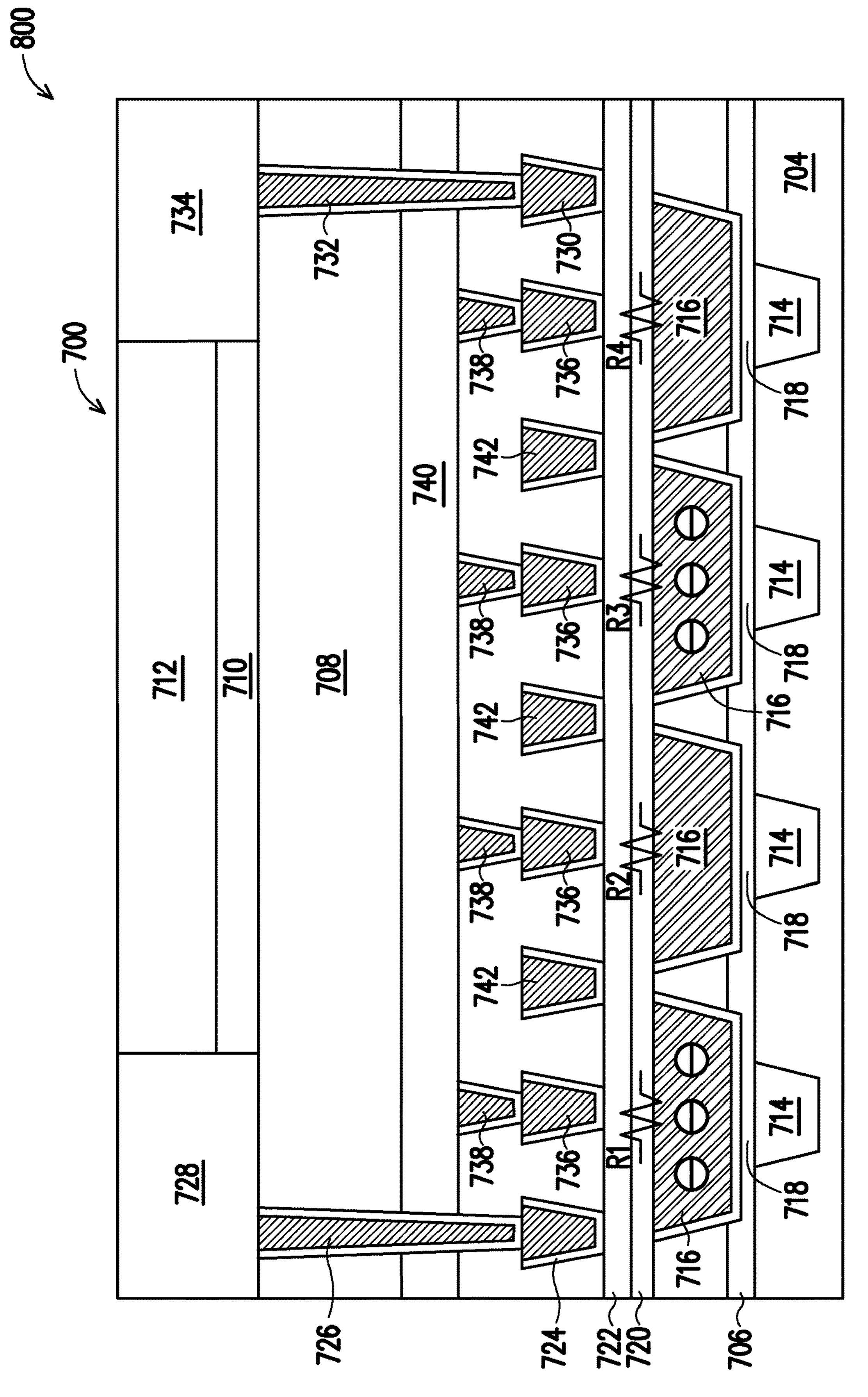
FIGS. 8A and 8B are diagrams of example implementations of a semiconductor device described herein.
Figure 8B:
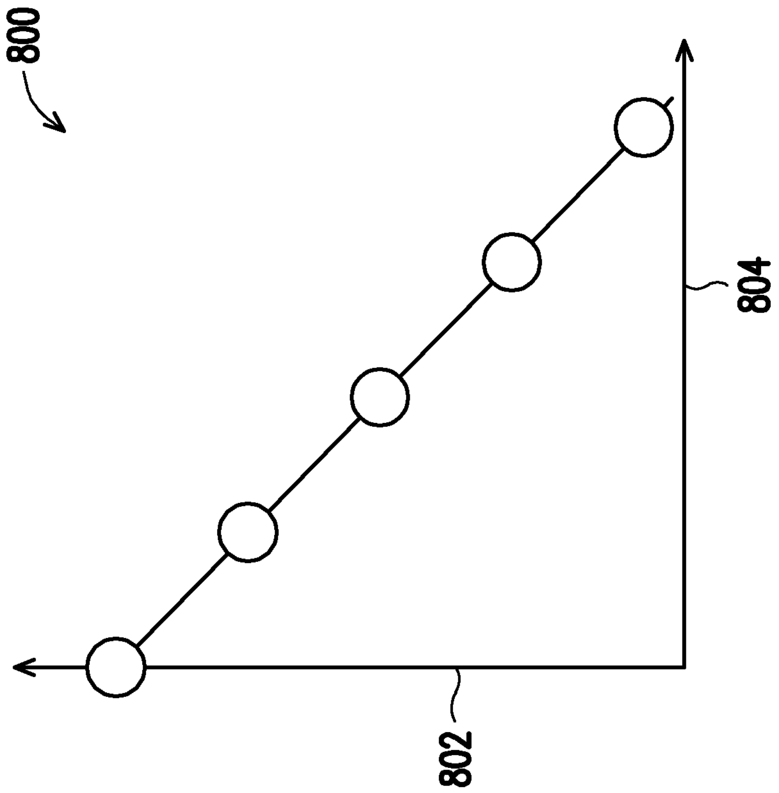

FIGS. 8A and 8B are diagrams of example implementations 800 of the semiconductor device 700 described herein. As shown in FIG. 8A, the gate structures 716 of the floating gate structures 702 may be configured to selectively store a charge. The charge stored in the gate structures 716 may influence or dictate the channel resistances (e.g., R1-R4) of the floating gate structures 702. The magnitude of a read current through the series chain of floating gate structures 702 may be based on the channel resistances of the floating gate structures 702.

As shown in FIG. 8B, the read current 802 through the series chain of floating gate structures 702 may be linearly dependent (e.g., inversely proportional to) the combined channel resistance 804 of the floating gate structures 702. The analog states of the neural network may be determined based on the read current 802 through the series chain of floating gate structures 702.

As indicated above, FIGS. 8A and 8B are provided as examples. Other examples may differ from what is described with regard to FIGS. 8A and 8B.

Figure 9:
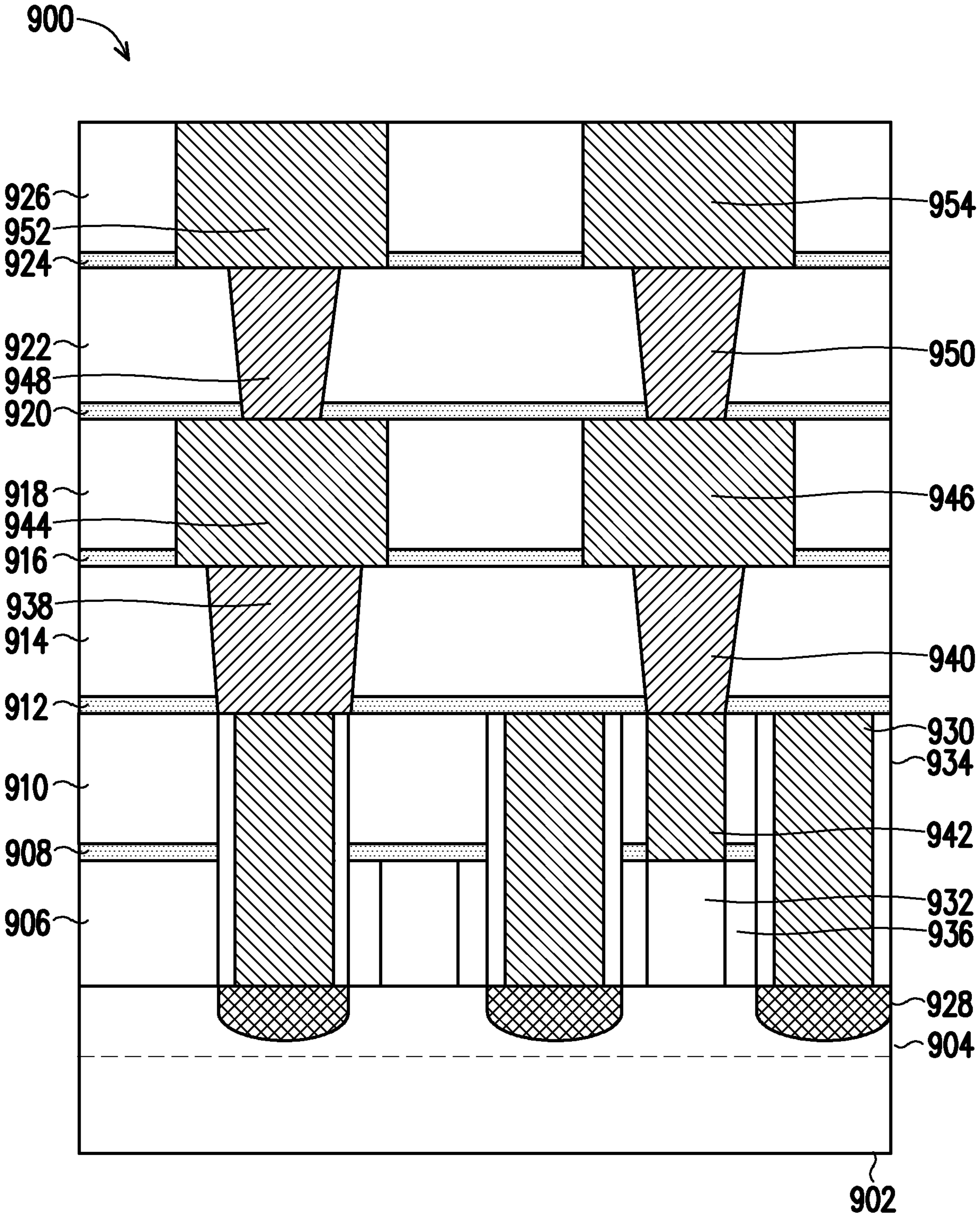
FIG. 9 is a diagram of an example semiconductor device described herein.

FIG. 9 is a diagram of a portion of an example semiconductor device 900 described herein. The semiconductor device 900 includes an example of a semiconductor device that may include a memory device (e.g., an SRAM, a DRAM), a logic device, a processor, an input/output device, or another type of semiconductor device that includes one or more transistors. The semiconductor device 900 may include a substrate 902 and one or more fin structures 904 formed in the substrate 902.

The semiconductor device 900 includes one or more stacked layers, including a dielectric layer 906, an etch stop layer (ESL) 908, a dielectric layer 910, an ESL 912, a dielectric layer 914, an ESL 916, a dielectric layer 918, an ESL 920, a dielectric layer 922, an ESL 924, and a dielectric layer 926, among other examples. The dielectric layers 906, 910, 914, 918, 922, and 926 are included to electrically isolate various structures of the semiconductor device 900. The dielectric layers 906, 910, 914, 918, 922, and 926 include a silicon nitride (SiNx), an oxide (e.g., a silicon oxide (SiOx) and/or another oxide material), and/or another type of dielectric material. The ESLs 908, 912, 916, 920, 924 includes a layer of material that is configured to permit various portions of the semiconductor device 900 (or the layers included therein) to be selectively etched or protected from etching to form one or more of the structures included in the semiconductor device 900.

As further shown in FIG. 9, the semiconductor device 900 includes a plurality of epitaxial (epi) regions 928 that are grown and/or otherwise formed on and/or around portions of the fin structure 904. The epitaxial regions 928 are formed by epitaxial growth. In some implementations, the epitaxial regions 928 are formed in recessed portions in the fin structure 904. The recessed portions may be formed by strained source drain (SSD) etching of the fin structure 904 and/or another type etching operation. The epitaxial regions 928 function as source or drain regions of the transistors included in the semiconductor device 900.

The epitaxial regions 928 are electrically connected to metal source or drain contacts 930 of the transistors included in the semiconductor device 900. The metal source or drain contacts (MDs or CAs) 930 include cobalt (Co), ruthenium (Ru), and/or another conductive or metal material. The transistors further include gates 932 (MGs), which are formed of a polysilicon material, a metal (e.g., tungsten (W) or another metal), and/or another type of conductive material. The metal source or drain contacts 930 and the gates 932 are electrically isolated by one or more sidewall spacers, including spacers 934 on each side of the metal source or drain contacts 930 and spacers 936 on each side of the gate 932. The spacers 934 and 936 include a silicon oxide ($SiO_x$), a silicon nitride ($Si_xN_y$), a silicon oxy carbide (SiOC), a silicon oxycarbonitride (SiOCN), and/or another suitable material. In some implementations, the spacers 934 are omitted from the sidewalls of the source or drain contacts 930.

As further shown in FIG. 9, the metal source or drain contacts 930 and the gates 932 are electrically connected to one or more types of interconnects. The interconnects electrically connect the transistors of the semiconductor device 900 and/or electrically connect the transistors to other areas and/or components of the semiconductor device 900. In some implementations, the interconnects electrically connect the transistors in the front end of line (FEOL) region of the semiconductor device 900 to a back end of line (BEOL) region of the semiconductor device 900.

The metal source or drain contacts 930 are electrically connected to source or drain interconnects 938 (e.g., source/drain vias or VDs). One or more of the gates 932 are electrically connected to gate interconnects 940 (e.g., gate vias or VGs). The interconnects 938 and 940 include a conductive material such as tungsten, cobalt, ruthenium, copper, and/or another type of conductive material. In some implementations, the gates 932 are electrically connected to the gate interconnects 940 by gate contacts 942 (CB or MP) to reduce contact resistance between the gates 932 and the gate interconnects 940. The gate contacts 942 include tungsten (W), cobalt (Co), ruthenium (Ru), titanium (Ti), aluminum (Al), copper (Cu) or gold (Au), among other examples of conductive materials.

As further shown in FIG. 9, the interconnects 938 and 940 are electrically connected to a plurality of BEOL layers, each including one or more metallization layers and/or vias. As an example, the interconnects 938 and 940 may be electrically connected to an MO metallization layer that includes conductive structures 944 and 946. The MO metallization layer is electrically connected to a VO via layer that includes vias 948 and 950. The VO via layer is electrically connected to an Ml metallization that includes conductive structures 952 and 954. In some implementations, the BEOL layers of the semiconductor device 900 includes additional metallization layers and/or vias that connect the semiconductor device 900 to a package.

One or more memory cell arrays (e.g., a volatile memory array 202*a*, a non-volatile memory array 202*b*) may be included in one or more layers in the BEOL region of the semiconductor device 900. In some implementations, a plurality of volatile memory cells structures 216 of a volatile memory array 202*a* and/or a plurality of non-volatile memory cell structures 256 of a non-volatile memory array 202*b* may be included in the dielectric layer 914 the dielectric layer 918, the dielectric layer 922, and/or the ESL 924.

As indicated above, FIG. 9 is provided as an example. Other examples may differ from what is described with regard to FIG. 9.

Figure 10:
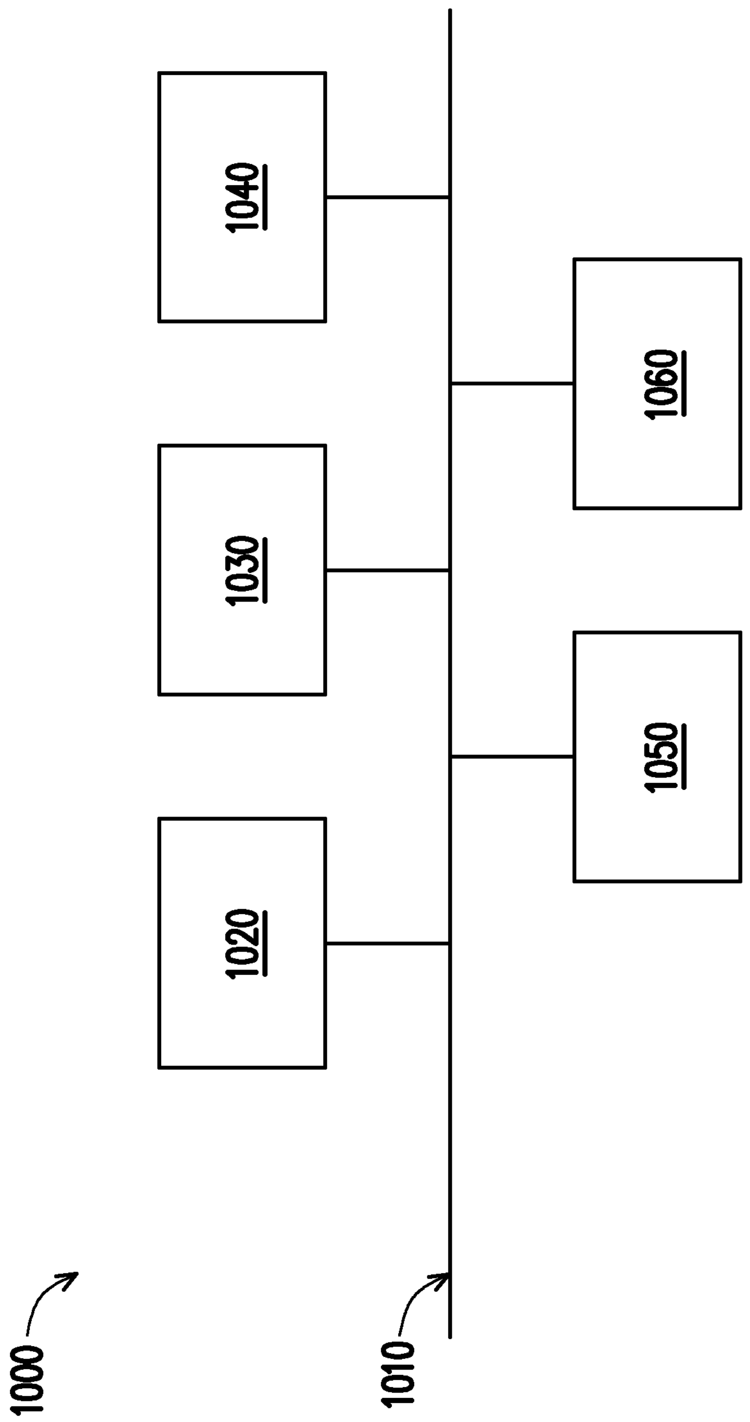
FIG. 10 is a diagram of example components of one or more devices of FIG. 1 described herein.

FIG. 10 is a diagram of example components of a device 1000 described herein. In some implementations, one or more of the semiconductor processing tools 102-112 and/or the wafer/die transport tool 114 may include one or more devices 1000 and/or one or more components of device 1000. As shown in FIG. 10, device 1000 may include a bus 1010, a processor 1020, a memory 1030, an input component 1040, an output component 1050, and a communication component 1060.

Bus 1010 may include one or more components that enable wired and/or wireless communication among the components of device 1000. Bus 1010 may couple together two or more components of FIG. 10, such as via operative coupling, communicative coupling, electronic coupling, and/or electric coupling. Processor 1020 may include a central processing unit, a graphics processing unit, a microprocessor, a controller, a microcontroller, a digital signal processor, a field-programmable gate array, an application-specific integrated circuit, and/or another type of processing component. Processor 1020 is implemented in hardware, firmware, or a combination of hardware and software. In some implementations, processor 1020 may include one or more processors capable of being programmed to perform one or more operations or processes described elsewhere herein.

Memory 1030 may include volatile and/or nonvolatile memory. For example, memory 1030 may include random access memory (RAM), read only memory (ROM), a hard disk drive, and/or another type of memory (e.g., a flash memory, a magnetic memory, and/or an optical memory). Memory 1030 may include internal memory (e.g., RAM, ROM, or a hard disk drive) and/or removable memory (e.g., removable via a universal serial bus connection). Memory 1030 may be a non-transitory computer-readable medium. Memory 1030 stores information, instructions, and/or software (e.g., one or more software applications) related to the operation of device 1000. In some implementations, memory 1030 may include one or more memories that are coupled to one or more processors (e.g., processor 1020), such as via bus 1010.

Input component 1040 enables device 1000 to receive input, such as user input and/or sensed input. For example, input component 1040 may include a touch screen, a keyboard, a keypad, a mouse, a button, a microphone, a switch, a sensor, a global positioning system sensor, an accelerometer, a gyroscope, and/or an actuator. Output component 1050 enables device 1000 to provide output, such as via a display, a speaker, and/or a light-emitting diode. Communication component 1060 enables device 1000 to communicate with other devices via a wired connection and/or a wireless connection. For example, communication component 1060 may include a receiver, a transmitter, a transceiver, a modem, a network interface card, and/or an antenna.

Device 1000 may perform one or more operations or processes described herein. For example, a non-transitory computer-readable medium (e.g., memory 1030) may store a set of instructions (e.g., one or more instructions or code) for execution by processor 1020. Processor 1020 may execute the set of instructions to perform one or more operations or processes described herein. In some implementations, execution of the set of instructions, by one or more processors 1020, causes the one or more processors 1020 and/or the device 1000 to perform one or more operations or processes described herein. In some implementations, hardwired circuitry is used instead of or in combination with the instructions to perform one or more operations or processes described herein. Additionally, or alternatively, processor 1020 may be configured to perform one or more operations or processes described herein. Thus, implementations described herein are not limited to any specific combination of hardware circuitry and software.

The number and arrangement of components shown in FIG. 10 are provided as an example. Device 1000 may include additional components, fewer components, different components, or differently arranged components than those shown in FIG. 10. Additionally, or alternatively, a set of components (e.g., one or more components) of device 1000 may perform one or more functions described as being performed by another set of components of device 1000.

Figure 11:
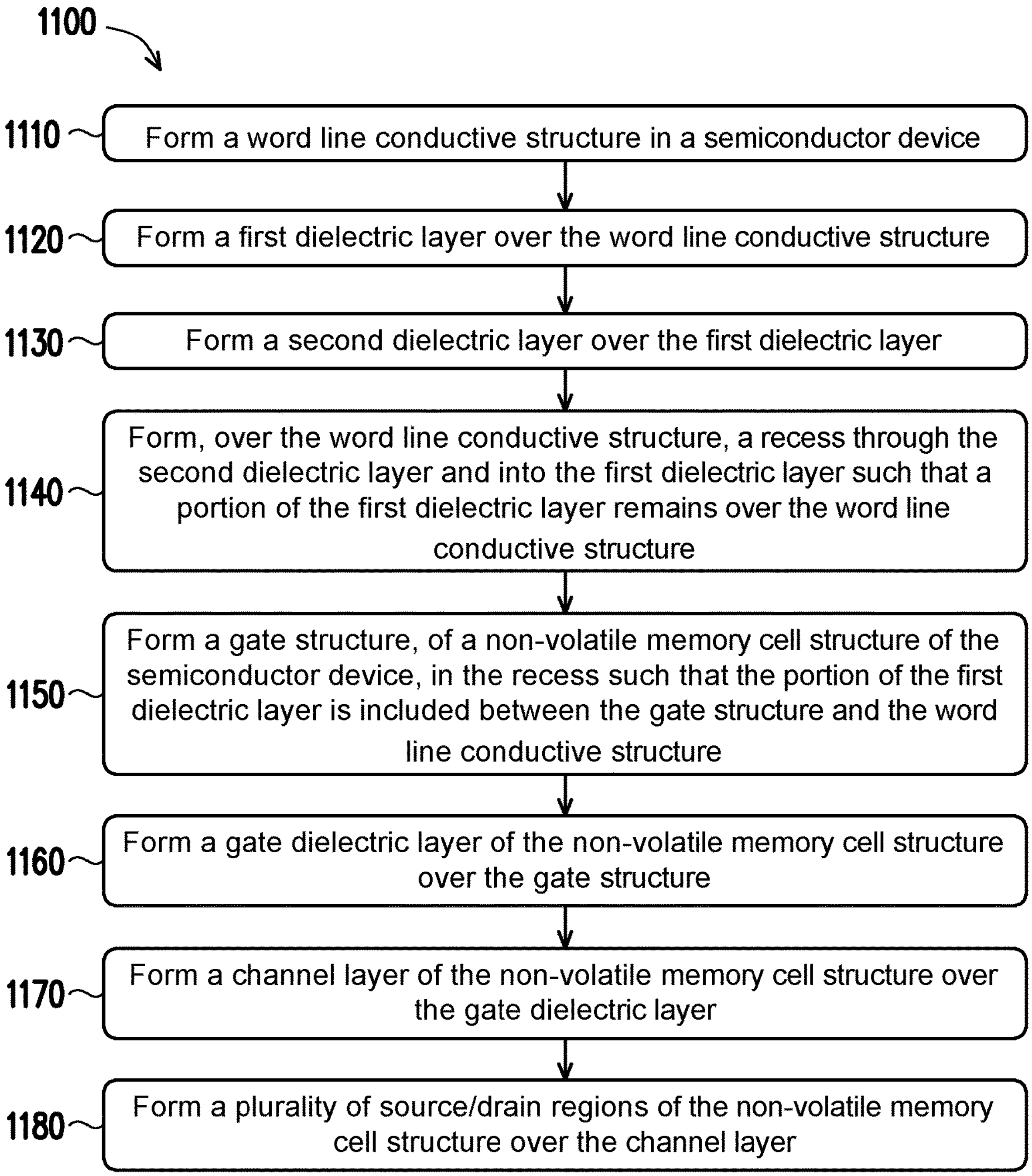
FIG. 11 is a flowchart of an example process associated with forming a semiconductor device described herein.

FIG. 11 is a flowchart of an example process 1100 associated forming a semiconductor device described herein. In some implementations, one or more process blocks of FIG. 11 are performed by one or more semiconductor processing tools (e.g., one or more of the semiconductor processing tools 102-112). Additionally, or alternatively, one or more process blocks of FIG. 11 may be performed by one or more components of device 1000, such as processor 1020, memory 1030, input component 1040, output component 1050, and/or communication component 1060.

As shown in FIG. 11, process 1100 may include forming a word line conductive structure in a semiconductor device (block 1110). For example, one or more of the semiconductor processing tools 102-112 may form a word line conductive structure 258 in a semiconductor device 200, as described herein.

As further shown in FIG. 11, process 1100 may include forming a first dielectric layer over the word line conductive structure (block 1120). For example, one or more of the semiconductor processing tools 102-112 may form a first dielectric layer 208 over the word line conductive structure 258, as described herein.

As further shown in FIG. 11, process 1100 may include forming a second dielectric layer over the first dielectric layer (block 1130). For example, one or more of the semiconductor processing tools 102-112 may form a second dielectric layer 210 over the first dielectric layer 208, as described herein.

As further shown in FIG. 11, process 1100 may include forming, over the word line conductive structure, a recess through the second dielectric layer and into the first dielectric layer such that a portion of the first dielectric layer remains over the word line conductive structure (block 1140). For example, one or more of the semiconductor processing tools 102-112 may form, over the word line conductive structure 258, a recess 604 through the second dielectric layer 210 and into the first dielectric layer 208 such that a portion 262 of the first dielectric layer 208 remains over the word line conductive structure 258, as described herein.

As further shown in FIG. 11, process 1100 may include forming a gate structure, of a non-volatile memory cell structure of the semiconductor device, in the recess such that the portion of the first dielectric layer is included between the gate structure and the word line conductive structure (block 1150). For example, one or more of the semiconductor processing tools 102-112 may form a gate structure 260, of a non-volatile memory cell structure 256 of the semiconductor device 200, in the recess 604 such that the portion 262 of the first dielectric layer 208 is included between the gate structure 260 and the word line conductive structure 258, as described herein.

As further shown in FIG. 11, process 1100 may include forming a gate dielectric layer of the non-volatile memory cell structure over the gate structure (block 1160). For example, one or more of the semiconductor processing tools 102-112 may form a gate dielectric layer 268 of the non-volatile memory cell structure 256 over the gate structure 260, as described herein.

As further shown in FIG. 11, process 1100 may include forming a channel layer of the non-volatile memory cell structure over the gate dielectric layer (block 1170). For example, one or more of the semiconductor processing tools 102-112 may form a channel layer 270 of the non-volatile memory cell structure 256 over the gate dielectric layer 268, as described herein.

As further shown in FIG. 11, process 1100 may include forming a plurality of source/drain regions of the non-volatile memory cell structure over the channel layer (block 1180). For example, one or more of the semiconductor processing tools 102-112 may form a plurality of source/drain regions 272 and 274 of the non-volatile memory cell structure 256 over the channel layer 270, as described herein.

Process 1100 may include additional implementations, such as any single implementation or any combination of implementations described below and/or in connection with one or more other processes described elsewhere herein.

In a first implementation, process 1100 includes forming an interconnect structure 276 over a source/drain region 272 of the plurality of source/drain regions such that the interconnect structure 276 is coupled with the source/drain region 272, and forming a bit line conductive structure 278 over the interconnect structure 276 such that the bit line conductive structure 278 is coupled with the interconnect structure 276. In a second implementation, alone or in combination with the first implementation, process 1100 includes forming another interconnect structure 280 over another source/drain region 274 of the plurality of source/drain regions such that the other interconnect structure 280 is coupled with the other source/drain region 274, and forming a select line conductive structure 282 over the other interconnect structure 280 such that the select line conductive structure 282 is coupled with the other interconnect structure 280.

In a third implementation, alone or in combination with one or more of the first and second implementations, process 1100 includes forming another word line conductive structure 222 in the semiconductor device 200, forming, over the other word line conductive structure 222, another recess 602 through the second dielectric layer 210 and through the first dielectric layer 208 such that a top surface of the other word line conductive structure 222 is exposed through the other recess 602, forming another gate structure 224, of a volatile memory cell structure 216 of the semiconductor device 200, in the other recess 602 such that the other gate structure 224 is directly connected with the other word line conductive structure 222, forming another gate dielectric layer 230 of the volatile memory cell structure 216 over the other gate structure 224, forming another channel layer 232 of the volatile memory cell structure 216 over the other gate dielectric layer 230, and forming a plurality of other source/drain regions 234 and 236 of the volatile memory cell structure 216 over the other channel layer 232.

In a fourth implementation, alone or in combination with one or more of the first through third implementations, forming the recess 604 forming the recess 604 such that a width W2 of the recess 604 is lesser relative to a width W1 of the other recess 602. In a fifth implementation, alone or in combination with one or more of the first through fourth implementations, the recess 604 and the other recess 602 are formed in a same etch operation. In a sixth implementation, alone or in combination with one or more of the first through fifth implementations, the first dielectric layer 208 includes an etch stop layer in the semiconductor device 200, and the etch stop layer includes at least one of silicon carbon nitride (SiCN), or aluminum oxide ($AlO_x$).

Although FIG. 11 shows example blocks of process 1100, in some implementations, process 1100 includes additional blocks, fewer blocks, different blocks, or differently arranged blocks than those depicted in FIG. 11. Additionally, or alternatively, two or more of the blocks of process 1100 may be performed in parallel.

In this way, a semiconductor device may include a non-volatile memory cell structure that may be formed in a back end region of a semiconductor device. The non-volatile memory cell structure may include a floating gate structure in which a portion of a dielectric layer is included between a gate structure and a word line conductive structure. The separation of the gate structure and the word line conductive structure by the dielectric layer results in the gate structure being a floating gate structure. This enables a charge to be selectively stored on the gate structure, even when power is removed from the word line conductive structure. The non-volatile memory cell structure along with a volatile memory cell structure (e.g., a DRAM memory cell structure) are provided in the back end region of the semiconductor device, such that caching and long-term storage may be performed in the back end region of the semiconductor device.

As described in greater detail above, some implementations described herein provide a semiconductor device. The semiconductor device includes a plurality of back end dielectric layers. The semiconductor device includes a conductive structure in a first back end dielectric layer of the plurality of back end dielectric layers. The semiconductor device includes a gate structure, of a non-volatile memory cell structure included in the semiconductor device, in a second back end dielectric layer and a third back end dielectric layer of the plurality of back end dielectric layers, where the gate structure is over the conductive structure, and where a portion of the second back end dielectric layer is included between the conductive structure and the gate structure.

As described in greater detail above, some implementations described herein provide a method. The method includes forming a word line conductive structure in a semiconductor device. The method includes forming a first dielectric layer over the word line conductive structure. The method includes forming a second dielectric layer over the first dielectric layer. The method includes forming, over the word line conductive structure, a recess through the second dielectric layer and into the first dielectric layer such that a portion of the first dielectric layer remains over the word line conductive structure. The method includes forming a gate structure, of a non-volatile memory cell structure of the semiconductor device, in the recess such that the portion of the first dielectric layer is included between the gate structure and the word line conductive structure. The method includes forming a gate dielectric layer of the non-volatile memory cell structure over the gate structure. The method includes forming a channel layer of the non-volatile memory cell structure over the gate dielectric layer. The method includes forming a plurality of source/drain regions of the non-volatile memory cell structure over the channel layer.

As described in greater detail above, some implementations described herein provide a semiconductor device. The semiconductor device includes a plurality of floating gate structures connected in series, comprising, respective gate structures included in each of the plurality of floating gate structures a gate dielectric layer that extends continuously over the respective gate structures a channel layer that extends continuously over the gate dielectric layer. The semiconductor device includes a plurality of word line conductive structures, where each of the plurality of word line conductive structures is electrically coupled with one of the respective gate structures. The semiconductor device includes a dielectric layer between the respective gate structures and the plurality of word line conductive structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a plurality of back end dielectric layers;

a plurality of conductive structures adjacent to each other and in a first back end dielectric layer of the plurality of back end dielectric layers;

a plurality of gate structures, of respective non-volatile memory cell structures included in the semiconductor device, in a second back end dielectric layer and a third back end dielectric layer of the plurality of back end dielectric layers, wherein the plurality of gate structures are respectively over the plurality of conductive structures, and wherein portions of the second back end dielectric layer are included between each conductive structure, of the plurality of conductive structures, and a corresponding gate structure of the plurality of gate structures; and a gate dielectric layer extends continuously over the plurality of gate structures.

2. The semiconductor device of claim 1, further comprising:

a channel layer, of the respective non-volatile memory cell structures, over the gate dielectric layer, wherein the channel layer is included in the third back end dielectric layer.

3. The semiconductor device of claim 1, wherein the plurality of conductive structures includes a conductive structure that corresponds to a word line conductive structure that is coupled with a non-volatile memory cell structure of the respective non-volatile memory cell structures;

wherein the semiconductor device further comprises:

a bit line conductive structure coupled with a first source/drain region; and a select line conductive structure coupled with a second source/drain region.

4. The semiconductor device of claim 1, further comprising:

another gate structure, of a volatile memory cell structure included in the semiconductor device, in the second back end dielectric layer and the third back end dielectric layer, wherein the other gate structure is over and in physical contact with a conductive structure of the plurality of conductive structures.

5. The semiconductor device of claim 4, wherein a width of a gate structure of the plurality of gate structures is lesser relative to a width of the other gate structure.

6. The semiconductor device of claim 4, wherein the volatile memory cell structure comprises:

a deep trench capacitor structure above the other gate structure, wherein the volatile memory cell structure is configured to selectively store an electrical charge in the deep trench capacitor structure, and wherein the respective non-volatile memory cell structures is configured to selectively store an electrical charge in respective gate structure of the plurality of gate structures.

7. The semiconductor device of claim 2, further comprising:

a plurality of source/drain regions, of the respective non-volatile memory cell structures, coupled with the channel layer, wherein the plurality of source/drain regions are included in the third back end dielectric layer.

8. A method, comprising:

forming a plurality of word line conductive structures in a semiconductor device;

forming a first dielectric layer over a word line conductive structure of the plurality of word line conductive structures;

forming a second dielectric layer over the first dielectric layer;

forming, over the word line conductive structure, a recess through the second dielectric layer and into the first dielectric layer such that a portion of the first dielectric layer remains over the word line conductive structure;

forming, over another word line conductive structure of the plurality of word line conductive structures, another recess through the second dielectric layer and through the first dielectric layer such that a top surface of another word line conductive structure of the plurality of word line conductive structures is exposed through the other recess;

forming a gate structure, of a non-volatile memory cell structure of the semiconductor device, in the recess such that the portion of the first dielectric layer is included between the gate structure and the word line conductive structure;

forming another gate structure, of a volatile memory cell structure of the semiconductor device, in the other recess such that the other gate structure is directly connected with the other word line conductive structure;

forming a gate dielectric layer of the non-volatile memory cell structure over the gate structure;

forming a channel layer of the non-volatile memory cell structure over the gate dielectric layer; and forming a plurality of source/drain regions of the non-volatile memory cell structure over the channel layer.

9. The method of claim 8, further comprising:

forming an interconnect structure over a source/drain region of the plurality of source/drain regions such that the interconnect structure is coupled with the source/drain region; and forming a bit line conductive structure over the interconnect structure such that the bit line conductive structure is coupled with the interconnect structure.

10. The method of claim 9, further comprising:

forming another interconnect structure over another source/drain region of the plurality of source/drain regions such that the other interconnect structure is coupled with the other source/drain region; and forming a select line conductive structure over the other interconnect structure such that the select line conductive structure is coupled with the other interconnect structure.

11. The method of claim 8, further comprising:

forming another gate dielectric layer of the volatile memory cell structure over the other gate structure;

forming another channel layer of the volatile memory cell structure over the other gate dielectric layer; and forming a plurality of other source/drain regions of the volatile memory cell structure over the other channel layer.

12. The method of claim 8, wherein forming the recess comprises:

forming the recess such that a width of the recess is lesser relative to a width of the other recess.

13. The method of claim 8, wherein the recess and the other recess are formed in a same etch operation.

14. The method of claim 8, wherein the first dielectric layer comprises an etch stop layer in the semiconductor device; and wherein the etch stop layer comprises at least one of:

silicon carbon nitride (SiCN), or aluminum oxide ($AlO_x$).

15. A semiconductor device, comprising:

a plurality of floating gate structures connected in series, comprising:

respective gate structures included in each of the plurality of floating gate structures;

a gate dielectric layer that extends continuously over the respective gate structures;

a channel layer that extends continuously over the gate dielectric layer;

a plurality of word line conductive structures, wherein each of the plurality of word line conductive structures is electrically coupled with one of the respective gate structures; and a dielectric layer between the respective gate structures and the plurality of word line conductive structures.

16. The semiconductor device of claim 15, wherein the respective gate structures and the plurality of word line conductive structures are separated by portions of the dielectric layer between the respective gate structures and the plurality of word line conductive structures.

17. The semiconductor device of claim 15, wherein the plurality of floating gate structures comprise:

respective source/drain regions, each electrically coupled with one of the respective gate structures; and wherein the semiconductor device further comprises:

a write bit line conductive structure, wherein the respective source/drain regions are connected with the write bit line conductive structure.

18. The semiconductor device of claim 15, wherein a first floating gate structure of the plurality of floating gate structures is electrically coupled with a read bit line conductive structure included in the semiconductor device; and wherein a second floating gate structure of the plurality of floating gate structures is electrically coupled with a select line conductive structure included in the semiconductor device.

19. The semiconductor device of claim 15, wherein the plurality of floating gate structures are included in a back end of line (BEOL) region of the semiconductor device.

20. The semiconductor device of claim 15, wherein the plurality of floating gate structures are configured as a deep neural network circuit in the semiconductor device.

* * * * *